(12) United States Patent
Hargreaves et al.

(10) Patent No.: US 7,301,350 B2
(45) Date of Patent: Nov. 27, 2007

(54) METHODS AND SYSTEMS FOR DETECTING A CAPACITANCE USING SIGMA-DELTA MEASUREMENT TECHNIQUES

(75) Inventors: Kirk Hargreaves, Mountain View, CA (US); Joseph Kurth Reynolds, Sunnyvale, CA (US); David Ely, Cambridge (GB); Julian Haines, Dublin (IE)

(73) Assignee: Synaptics Incorporated, Santa Clara, CA (US)

( * ) Notice: Subject to any disclaimer, the term of this patent is extended or adjusted under 35 U.S.C. 154(b) by 0 days.

(21) Appl. No.: 11/446,324

(22) Filed: Jun. 3, 2006

(65) Prior Publication Data

US 2007/0046299 A1   Mar. 1, 2007

Related U.S. Application Data

(60) Provisional application No. 60/784,544, filed on Mar. 21, 2006, provisional application No. 60/774,843, filed on Feb. 16, 2006, provisional application No. 60/687,167, filed on Jun. 3, 2005, provisional application No. 60/687,148, filed on Jun. 3, 2005, provisional application No. 60/687,039, filed on Jun. 3, 2005, provisional application No. 60/687,037, filed on Jun. 3, 2005, provisional application No. 60/687,012, filed on Jun. 3, 2005.

(51) Int. Cl.
  *G01R 27/26* (2006.01)
(52) U.S. Cl. ..................... 324/678; 324/679
(58) Field of Classification Search ............ 324/678, 324/679

See application file for complete search history.

(56) References Cited

U.S. PATENT DOCUMENTS

| 3,896,425 A | 7/1975 | Erichsen |
| 4,459,541 A | 7/1984 | Fielden et al. |
| 5,012,124 A | 4/1991 | Hollaway |
| 5,305,017 A | 4/1994 | Gerpheide |
| 5,451,940 A | 9/1995 | Schneider et al. |

(Continued)

FOREIGN PATENT DOCUMENTS

DE           3413849          8/1985

(Continued)

OTHER PUBLICATIONS

PCT International Search.

(Continued)

*Primary Examiner*—Vincent Q. Nguyen
(74) *Attorney, Agent, or Firm*—Ingrassia Fisher & Lorenz, P.C.

(57) ABSTRACT

Methods, systems and devices are described for detecting a measurable capacitance using sigma-delta measurement techniques. According to various embodiments, a voltage is applied to the measurable capacitance using a first switch. The measurable capacitance is allowed to share charge with a passive network. If the charge on the passive network is past a threshold value, then the charge on the passive network is changed by a known amount for a sufficient number of repetitions until the measurable capacitance can be detected. Such a detection scheme may be readily implemented using conventional components, and can be particularly useful in sensing the position of a finger, stylus or other object with respect to a button, slider, touchpad or other input sensor.

49 Claims, 22 Drawing Sheets

U.S. PATENT DOCUMENTS

| | | | |
|---|---|---|---|
| 5,543,591 | A | 8/1996 | Gillespie et al. |
| 5,659,254 | A | 8/1997 | Matsumoto et al. |
| 5,730,165 | A | 3/1998 | Philipp |
| 5,973,417 | A | 10/1999 | Goetz |
| 6,323,846 | B1 | 11/2001 | Westerman et al. |
| 6,452,514 | B1 | 9/2002 | Philipp |
| 6,466,036 | B1 | 10/2002 | Philipp |
| 6,535,200 | B2 | 3/2003 | Philipp |
| 6,593,755 | B1 | 7/2003 | Rosengren |
| 2003/0090277 | A1* | 5/2003 | Lechner et al. ............ 324/686 |
| 2004/0104826 | A1 | 6/2004 | Philipp |
| 2005/0068712 | A1 | 3/2005 | Schulz et al. |
| 2005/0099188 | A1 | 5/2005 | Baxter |

FOREIGN PATENT DOCUMENTS

| | | |
|---|---|---|
| EP | 1 521 090 | 4/2005 |
| EP | 1593988 | 5/2005 |
| FR | 2829317 | 3/2003 |
| JP | 3237594 | 10/1991 |
| WO | WO 2004/059343 A1 | 7/2004 |
| WO | WO 2004/066498 A1 | 8/2004 |
| WO | 2005031375 | 4/2005 |

OTHER PUBLICATIONS

Report PCT/US2006/021727 Nov. 17, 2006.

International Search Report for International Application No. PCT/US2006/021437, mailed Oct. 5, 2006.

Touch Sensor IC(B6TS). Omron Corporation [retrieved on Aug. 14, 2006]. Retrieved from Internet: <URL:www.omron.co.jp/ecb/products/touch/pdf/en-keisoku.pdf>.

Phillip, Hal; Fingering a Problem, New Electronics; Jan. 24, 2006; pp. 51-52; Retrieved from Internet: <URL:www.newelectronics.co.uk/articles/5676/fingering-a-problem.pdf>.

Cichocki, Andrzej et al.; A Switched Capacitor Interface for Capcaitive Sensors Based on Relaxation Oscillators; IEEE; Oct. 1990; pp. 797-799; vol. 39 No. 5.

Huang, S.M. et al.; Electronic Transducers for Industrial Measurement of Low Value Capacitances; J. Phys. E.: Sci. Instrum. 21; 1988; pp. 242-250.

Phillip, H.; Charge Transfer Sensing: Spread Spectrum Sensor Technology Blazes New Applications; Retrieved from Internet: <URL:www.qprox.com/background/white_paper.php.

Toth, F.; Design Method. for Low-Cost, High-Perf. Cap. Sensors; Delft Univ. of Tech.;1997; Retrieved from Internet: <URL:www.exalondelft.nl/download/CapacitiveSensors.PDF>.

Yamada, M. et al.; A Switched-Capacitor Interface for Capacitive Pressure Sensors; IEEE; Feb. 1992; pp. 81-86; vol. 31, No. 1.

Johns, D.A.; Analog Integrated Circuit Design; 1997; pp. 542, 543; John Wiley & Sons.

Banks; Low Cost, Low Speed A/D Conversion for Embedded Systems; Byte Craft Limited (retrieved on Jul. 25, 2006); Retrieved from Internet: <URL: www.bytecraft.com/addaconv.html>.

Cao, Y. et al.; High-Accuracy Circuits for On-Chip Capacitance Ratio Testing or Sensor Readout; IEEE Transactions; Sep. 1994; pp. 637-639; vol. 41, No. 9.

Josefsson, O.; Ask the Applications Engineer: Using Sigma-Delta Converters—Part 1; Analog Dialogue 30th Anniversary Reader Bonus; 1997; pp. 29-33.

Norsworthy, S.; Effective Dithering of Sigma-Delta Modulators; AT&T Bell Laboratories; IEEE; 1992; pp. 1304-1307.

Martin, K.; A Voltage-Controlled Switch Capacitor Relaxation Oscillator; IEEE Journ. of Solid-State Circuits; Aug. 1981; pp. 412-414; vol. SC-16, No. 4.

Seguine, D.; Capacitive Key Scan; Cypress MicroSystems; Oct. 2004; version 4.1.

Seguine, D.; Capacitive Switch Scan; Cypress MicroSystems; Apr. 2005; version 4.2.

Kremin, Victor et al., "Capacitance Sensing—Waterproof Capacitance Sensing—AN2398", Cypress Perform, Document No. 001-14501 Rev., Dec. 8, 2006, pp. 1-11.

Quantum Research Group, "Secrets of a Successful QTouch™ Design", Quantum Research Application Note AN-KD02, Rev. 1.03, Oct. 2005, pp. 1-11.

* cited by examiner

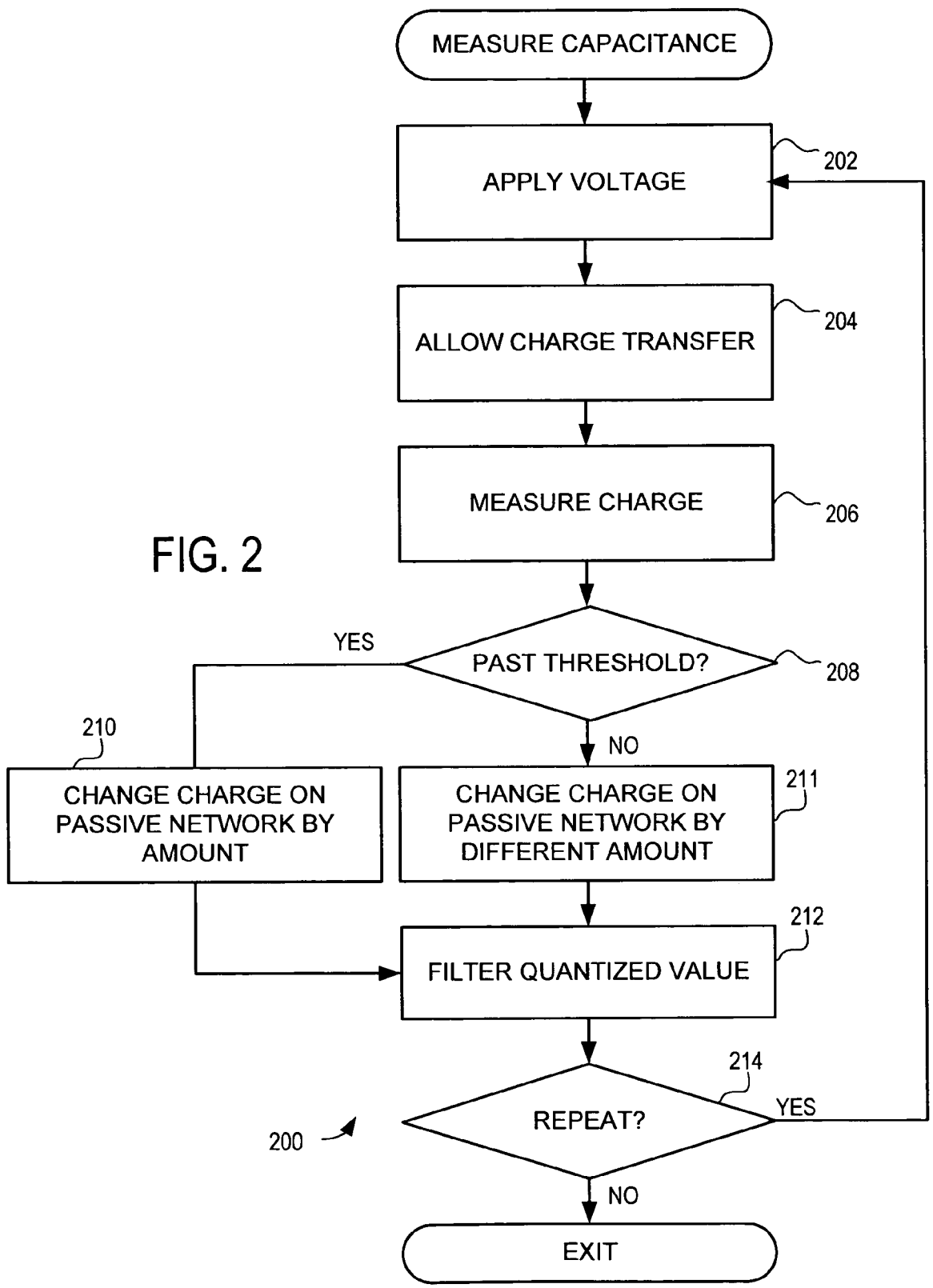

| STATE | 304 | 306 | 308 | STEP | DESCRIPTION |
|---|---|---|---|---|---|
| 1 | Z | 1 | 1 | 202 | CHARGE $C_X$, DISCHARGE $C_D$ |
| 2 | Z | Z | Z | | INTERMEDIATE, HIGH IMPEDANCE |
| 3 | 0 | Z | Z | 204 | SHARE CHARGE |
| 4 | 0 | Z | Z(READ) | 206 | COMPARE $V_I$ |
| 5A | 0 | 0 | Z | 210 | DELTA, IF DATA=1 CHANGE CHARGE (5A), ELSE DO NOT CHANGE CHARGE (5B) |
| 5B | 0 | Z | Z | 211 | |
| 6 | Z | Z | Z | | INTERMEDIATE, HIGH IMPEDANCE |

FIG. 3C

| STATE | 304 | 306 | STEP | DESCRIPTION |
|---|---|---|---|---|
| 0 | Z | 0 | | CURRENT CANCEL |
| 1 | 1 | 1 | 202 | CHARGE $C_X$, DISCHARGE $C_D$ |
| 2 | Z | Z | 204 | SHARE CHARGE ON $C_X$ |
| 3 | Z | Z | | INTERMEDIATE, HIGH IMPEDANCE, TRAP CHARGE |
| 4A | 0 | Z | 210 | DELTA, IF DATA=1 CHANGE CHARGE (4A), |
| 4B | 1 | Z | 211 | ELSE DO NOT CHANGE CHARGE (4B) |
| 5 | Z | Z | | TRAP CHARGE ON $C_I$ |
| 6 | Z | Z(READ) | 206 | COMPARE $C_I$ |

FIG. 4C

| STATE | 306 | STEP | DESCRIPTION |
|---|---|---|---|
| 0 | 0 | | CURRENT CANCEL |
| 1 | 1 | 202 | CHARGE $C_x$ |
| 2 | Z | 204 | SHARE CHARGE ON $C_x$ |
| 3 | Z(READ) | 206 | COMPARE $C_I$ |
| 4A | 0 | 210 | DELTA, IF DATA=1 CHANGE CHARGE (4A), ELSE DO NOT CHANGE CHARGE (4B) |
| 4B | Z | 211 | |

FIG. 5B

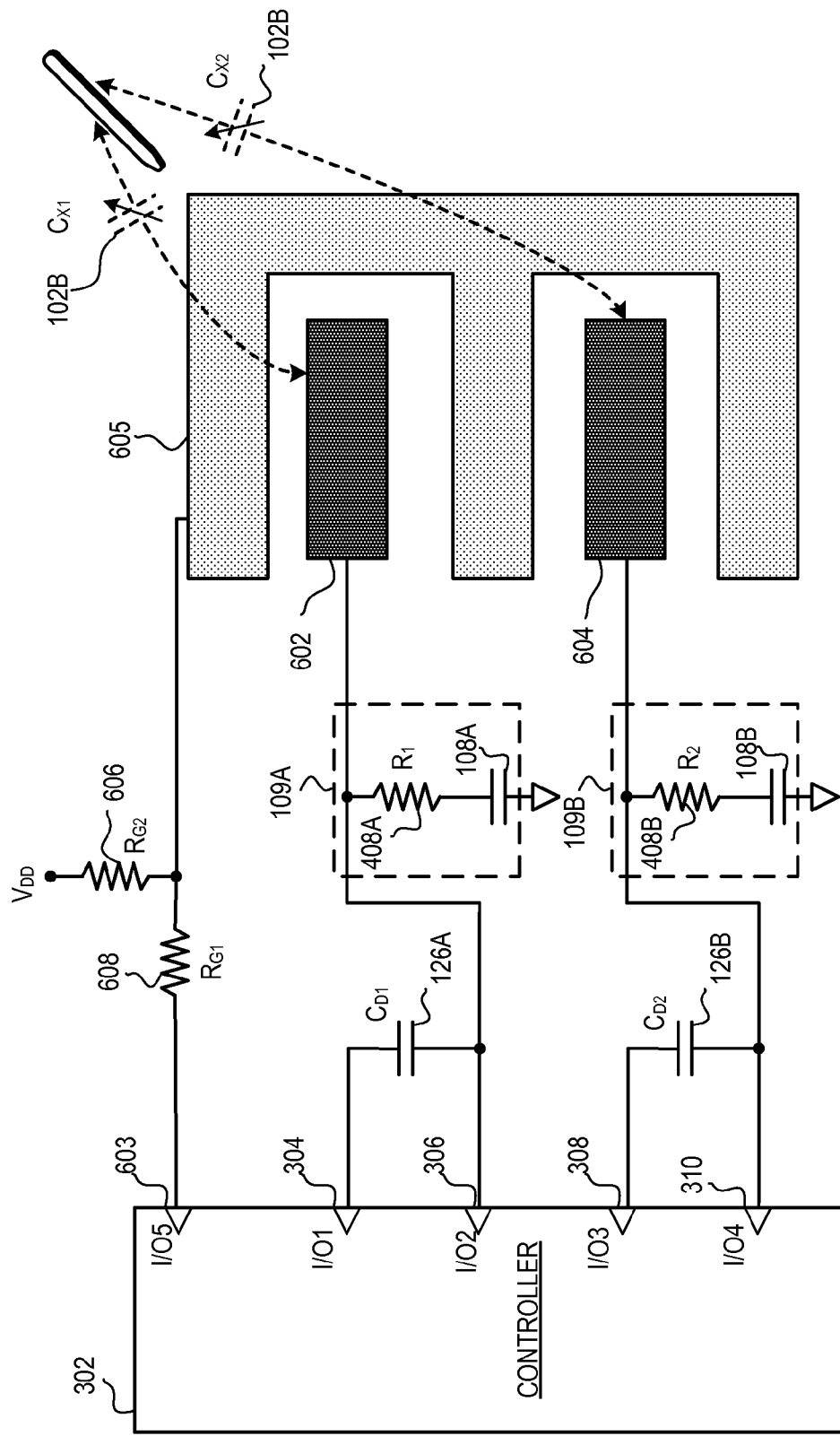

| STATE | 304 | 306 | 308 | 310 | 312 | DESCRIPTION |
|---|---|---|---|---|---|---|
| 1 | 0 | Z(READ) | 0 | Z(READ) | 0 | BLOCK MEASURABLE CAPACITANCE AND MEASURE INTEGRATING CAPACITANCE |
| 2 | Z | Z | 0 | Z | Z | INTERMEDIATE, HIGH IMPEDANCE |
| 3 | Z | 1 | 0 | 1 | Z | SHARE CHARGE WITH MEASURABLE CAPACITANCES, BLOCK DELTA CAPS |
| 4 | Z | 1 | 1 | 1 | Z | CLEAR DELTA CAPACITANCES |
| 5 | Z | Z | 1 | 1 | Z | DECOUPLE INTEGRATING CAPACITANCES THAT MEASURED HIGH |
| 6 | 0 | Z | 1 | 1 | Z | SHARE DELTA CAPS WITH INTEGRATING CAPACITANCES THAT MEASURED HIGH |
| 7 | 0 | Z | 0 | 1 | Z | TRANSFER DELTA CHARGE WITH INTEGRATING CAPS THAT MEASURED HIGH |
| 8 | 0 | Z | 0 | Z | Z | DECOUPLE INTEGRATING CAPS THAT MEASURED LOW |

FIG. 7B

| STATE | 304 I/O1 | 310 I/O4 | 306 I/O2 | 308 I/O3 | DESCRIPTION |
|---|---|---|---|---|---|
| 1A | 0 | $F(V_{Cl})=0$ | 1 | Z | DO NOT CHANGE CHARGE IF $F(V_{Cl})=0$ (1A) |
| 1B | 0 | $F(V_{Cl})=1$ | 1 | Z | CHANGE CHARGE ADDED IF $F(V_{Cl})=1$ (1B) |
| 2 | 0 | $F(V_{Cl})$ | Z | Z | INTERMEDIATE, HIGH IMPEDANCE |
| 3 | 0 | $F(V_{Cl})$ | Z | 0 | SHARE MEASURABLE CAPACITANCE WITH INTEGRATING CAPACITANCE |
| 4 | 1 | 0 | Z | 0 | TRANSFER CHARGE THROUGH MEASURABLE CAPACITANCE |
| 5 | 1 | 0 | Z | Z | INTERMEDIATE, HIGH IMPEDANCE |
| 6 | 1 | 0 | 1 | Z | SHARE INTEGRATING CAPACITANCE WITH DELTA CAPACITANCE |
| 7 | 0 | 0 | 1 | Z(READ) | MEASURE VOLTAGE ON INTEGRATING CAPACITANCE ($V_{Cl}$) AND CHARGE MEASURABLE CAPACITANCE |

| STATE | 304 I/O1 | 310 I/O5 | 306 I/O2 | 308A I/O3 | 308B I/O4 | 851 | DESCRIPTION |
|---|---|---|---|---|---|---|---|
| 1 | 0 | 1 | Z | Z | Z | Z | INTERMEDIATE, HIGH IMPEDANCE |
| 2 | 0 | 1 | Z | 1 | 0 | $V_G$ | SET VOLTAGE AT $C_I$ TO $V_G$ |
| 3 | 1 | $F(V_{CI})$ | Z | 1 | 0 | $V_G$ | DELTA CHARGE AND SHARE CHARGE |
| 4 | 1 | $F(V_{CI})$ | Z | Z | Z | Z | INTERMEDIATE, HIGH IMPEDANCE |
| 5 | 1 | $F(V_{CI})$ | 1 | Z | Z | Z | SET RECEIVING ELECTRODE HIGH |
| 6 | 0 | 1 | 1 | Z | Z | Z | CHARGE $C_X$ AND $C_D$ |
| 7 | 0 | 1 | 1 | Z(READ) | Z | Z | MEASURE VOLTAGE ON INTEGRATING CAPACITOR |

875 ⭢ FIG. 8D

METHODS AND SYSTEMS FOR DETECTING A CAPACITANCE USING SIGMA-DELTA MEASUREMENT TECHNIQUES

PRIORITY DATA

This application claims priority of U.S. Provisional Patent Application Ser. Nos. 60/687,012; 60/687,148; 60/687,167; 60/687,039; and 60/687,037, which were filed on Jun. 3, 2005 and Ser. No. 60/774,843 which was filed on Feb. 16, 2006, and Ser. No. 60/784,544 which was filed on Mar. 21, 2006, and are incorporated herein by reference.

TECHNICAL FIELD

The present invention generally relates to capacitance sensing, and more particularly relates to devices, systems and methods capable of detecting a measurable capacitance using sigma-delta-type measurement techniques.

BACKGROUND

Capacitance sensors that respond to charge, current, or voltage can be used to detect position or proximity (or motion or presence or any similar information), and are commonly used as input devices for computers, personal digital assistants (PDAs), media players, video game players, consumer electronics, cellular phones, payphones, point-of-sale terminals, automatic teller machines, kiosks and the like. Capacitive sensing techniques are used in user input buttons, slide controls, scroll rings, scroll strips and other types of sensors. One type of capacitance sensor used in such applications is the button-type sensor, which can be used to provide information about the existence or presence of an input. Another type of capacitance sensor used in such applications is the touchpad-type sensor, which can be used to provide information about an input such as the position, motion, and/or similar information along one axis (1-D sensor), two axes (2-D sensor), or more axes. Both the button-type and touchpad-type sensors can also optionally be configured to provide additional information such as some indication of the force, duration, or amount of capacitive coupling associated with the input. One example of a 2-D touchpad-type sensor that is based on capacitive sensing technologies is described in U.S. Pat. No. 5,880,411, which issued to Gillespie et al. on Mar. 9, 1999. Such sensors can be readily found, for example, in input devices of electronic systems including handheld and notebook-type computers.

A user generally operates a capacitive input device by placing or moving one or more fingers, styli, and/or objects, near a sensing region of one or more sensors located on or in the input device. This creates a capacitive effect upon a carrier signal applied to the sensing region that can be detected and correlated to positional information (such as the position(s) or proximity or motion or presences or similar information) of the stimulus/stimuli with respect to the sensing region. This positional information can in turn be used to select, move, scroll, or manipulate any combination of text, graphics, cursors and highlighters, and/or any other indicator on a display screen. This positional information can also be used to enable the user to interact with an interface, such as to control volume, to adjust brightness, or to achieve any other purpose.

Although capacitance sensors have been widely adopted for several years, sensor designers continue to look for ways to improve the sensors' functionality and effectiveness. In particular, engineers continually strive to simplify the design and implementation of position sensors without increasing costs. Moreover, as such sensors become increasingly in demand in various types of electronic devices, a need for a highly-flexible yet low cost and easy to implement sensor design arises. In particular, a need exists for a sensor design scheme that is flexible enough for a variety of implementations and powerful enough to provide accurate capacitance sensing while remaining cost effective.

Accordingly, it is desirable to provide systems and methods for quickly, effectively and efficiently detecting a measurable capacitance. Moreover, it is desirable to create a design scheme that can be readily implemented using readily available components, such as standard ICs, microcontrollers, and discrete components. Other desirable features and characteristics will become apparent from the subsequent detailed description and the appended claims, taken in conjunction with the accompanying drawings and the foregoing technical field and background.

BRIEF SUMMARY

Methods, systems and devices are described for detecting a measurable capacitance using sigma-delta measurement techniques that are implementable on many standard microcontrollers without requiring external active analog components. According to various embodiments, a voltage is applied to the measurable capacitance using a first switch. The measurable capacitance is allowed to share charge with a passive network. If the charge on the passive network is past a threshold value, then the charge on the passive network is changed by a predetermined amount and the process is repeated. The results of the charge threshold detection are a quantized measurement of the charge, which can be filtered to yield a measure of the measurable capacitance. Such a detection scheme may be readily implemented using readily available components, and can be particularly useful in sensing the position of a finger, stylus or other object with respect to a capacitive sensor implementing button function(s), slider function(s), cursor control or user interface navigation function(s), or any other functions.

BRIEF DESCRIPTION OF THE DRAWINGS

Various aspects of the present invention will hereinafter be described in conjunction with the following drawing figures, wherein like numerals denote like elements.

FIG. 2 is a flowchart of an exemplary sigma-delta capacitance sensing technique;

FIG. 3C is an exemplary timing chart and FIG. 3D is an exemplary timing diagram for the exemplary embodiment shown in FIG. 3A;

FIG. 4C is an exemplary timing chart and FIG. 4D is an exemplary timing diagram for the embodiment shown in FIG. 4A;

FIG. 5B is an exemplary timing chart and FIG. 5C is an exemplary timing diagram for the embodiment of FIG. 5A;

FIGS. 6A-B are diagrams of alternate exemplary sigma-delta capacitance detecting circuits that implement multiple sensing channels with a passive network and input/output pins of a digital controller;

FIG. 7A is a diagram of an exemplary multi-electrode sensor that includes a delta capacitance that is shared between sensing channels and FIG. 7B is an associated state sequence chart;

FIG. 8B is an associated state sequence chart, FIG. 8D is an associated state sequence chart;

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, a capacitance detection and/or measurement circuit can be readily formulated using sigma-delta modulation techniques. In general, the term "sigma delta" relates to an analog-to-digital conversion scheme that incorporates summation (sigma) and difference (delta) of electrical charge to quantify an electrical effect, such as capacitance, that is exhibited by an electrode or other electrical node. In sigma delta capacitance sensing, for example, an analog integrator typically accumulates charge transferred from the measurable capacitance from multiple charge transfer events. Additional electrical charge having an opposing sign to the charge received from the measurable capacitance is also applied in pre-set quantities to maintain the integrated charge near a known level. That is, a quantized amount of charge is appropriately subtracted from the analog integrator to maintain the filter output near the desired level. By correlating the amount of opposing charge applied to the integrator, the amount of charge transferred by the measurable capacitance can be ascertained. This capacitance value, in turn, can be used to identify the presence or absence of a human finger, stylus or other object in proximity to the sensed node, and/or for any other purpose. Sigma-delta schemes can therefore be applied in a number of different ways to determine an amount of capacitance present on an electrode or the like.

Additionally, various embodiments described below are readily implementable using only conventional switching mechanisms (e.g. signal pins of control devices, discrete switches, and the like), the input of a digital gate as a quantizer (which may also be implemented using signal pins of control devices), and passive components (e.g. one or more capacitors, resistors, and/or the like), without the need for additional active electronics that would add cost and complexity. As a result, the various schemes described herein may be conveniently yet reliably implemented in a variety of environments using readily-available and reasonably-priced components, as described more fully below.

Figure 1A:
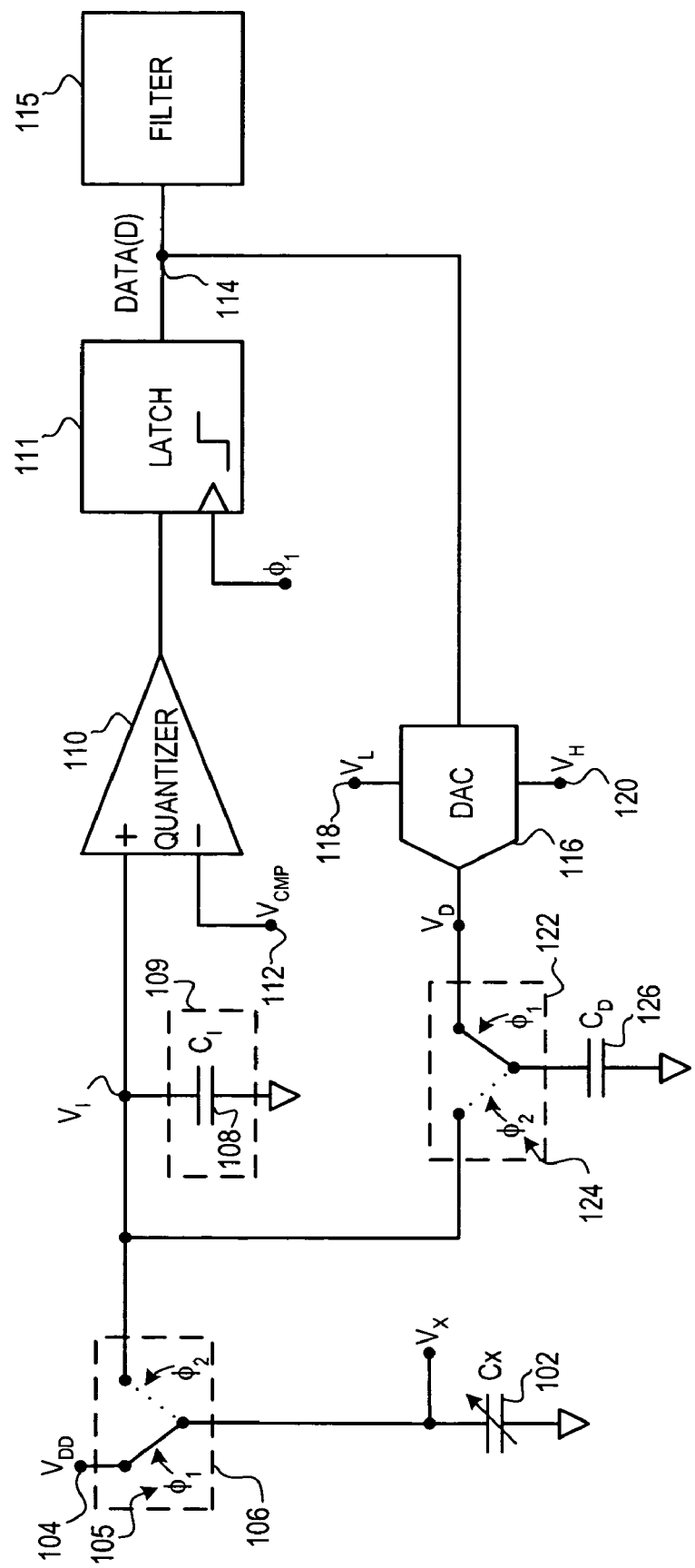
FIG. 1A is a block diagram showing an exemplary first-order sigma-delta sensing technique.

Turning now to the drawing figures and with initial reference to FIG. 1A, an exemplary first-order sigma-delta converter 100 for determining a measurable capacitance ($C_x$) 102 includes a passive network 109, a quantizer 110 (which can be a comparator or the input of a digital gate if a single-bit quantizer is desired), and a digital-to-analog converter 116 (which may be a switch to one or more voltages), as well as a suitable number of switches 106, 122 for allowing the measurable capacitance 102 and a delta "reference" capacitance ($C_D$) 126 to charge and discharge into an integrating capacitance 108 as appropriate.

In this embodiment, passive network 109 is implemented simply as an integrating capacitance 108. Integrating capacitance 108 ($C_I$) is shown implemented with a conventional capacitor configured as an imperfect integrator having a capacitance that is typically larger, and often significantly larger (e.g. by one or more orders of magnitude), than the value of the delta capacitance 126 or the expected value of measurable capacitance 102. In various embodiments, for example, measurable capacitance 102 and delta capacitance 126 may be on the order of picofarads while the integrating capacitance 108 is on the order of nanofarads, although other embodiments may incorporate widely different values for the particular capacitances. The effective delta capacitance 126, in combination with the digital-to-analog converter voltages 118, 120 and the charging voltage 104 determines the range of measurable capacitance values. It is also possible to reverse the roles of measurable capacitance 102 and delta capacitance 126 in FIG. 1. In this case, charge would be transferred to integrating capacitance 108 from delta capacitance 126 by switch 106, and measurable capacitance 102 would be the feedback capacitance transferred by switch 122 and controlled by data 114. This results in a data output 114 being inversely proportional to the measurable capacitance 102 and directly proportional to the delta capacitance 126. Such a "reciprocal capacitance" sensor may be beneficial over a directly proportional capacitance sensor in embodiments wherein the signal or noise present is determined or filtered in the reciprocal regime.

Measurable capacitance 102 is the effective capacitance of any signal source, electrode or other electrical node having an electrical capacitance that is detectable by sigma-delta converter 100. Measurable capacitance 102 is shown as a variable capacitor in FIG. 1A. For input devices accepting input from one or more fingers, styli, and/or other stimuli, measurable capacitance 102 often represents the total effective capacitance from a sensing node to the local ground of the system ("absolute capacitance"). The total effective capacitance for input devices can be quite complex, involving capacitances, resistances, and inductances in series and in parallel as determined by the sensor design and the operating environment. In other cases, measurable capacitance 102 may represent the total effective capacitance from a driving node to a sensing node ("transcapacitance"). This total effective capacitance can also be quite complex. However, in many cases the input can be modeled simply as a small variable capacitance in parallel with a fixed background capacitance. In any case, a charging voltage 104 referenced to the local system ground is initially applied to measurable capacitance 102, as described more fully below, and measurable capacitance 102 is then allowed to share charge resulting from the application of charging voltage 104 with passive network 109.

In the exemplary sigma-delta converter 100 shown in FIG. 1A, measurable capacitance 102 is charged to charging voltage 104 and shares charge with integrating capacitance 108 in response to the position of switch 106. Similarly, delta capacitance 126 is charged with an appropriate value (e.g. low or high reference voltages 118 and 120, described below) and applied to integrating capacitance 108 via switch 122. Switches 106 and 122 are placed into appropriate states in response to control signals 105 and 124, respectively, which are any electrical, logical or other signals suitable for placing switches 106 and 122 into the appropriate states at appropriate times. In various embodiments, switches 106 and 122 are provided by input/output signal pins of a digital control circuit that are controlled in response to internal control signals generated within the control circuit as appropriate. In the simple conceptual embodiment shown in FIG. 1A control signals 105 and 124 are indicated by symbols $\phi_1$ and $\phi_2$. These control signals may be periodic, aperiodic, generated by control logic, and/or the like. In various embodiments, delta capacitance 126 can be charged and shared to integrating capacitance 108 several times in succession. Such embodiments would allow a relatively small delta capacitance 126 to behave as much larger effective capacitance. That is, the actual change in charge (or "delta") applied to integrating capacitance 108 is determined not only by the value of delta capacitance 126, but also by the particular control logic applied via switch 122 and the value of the reference voltages.

Figure 1B:
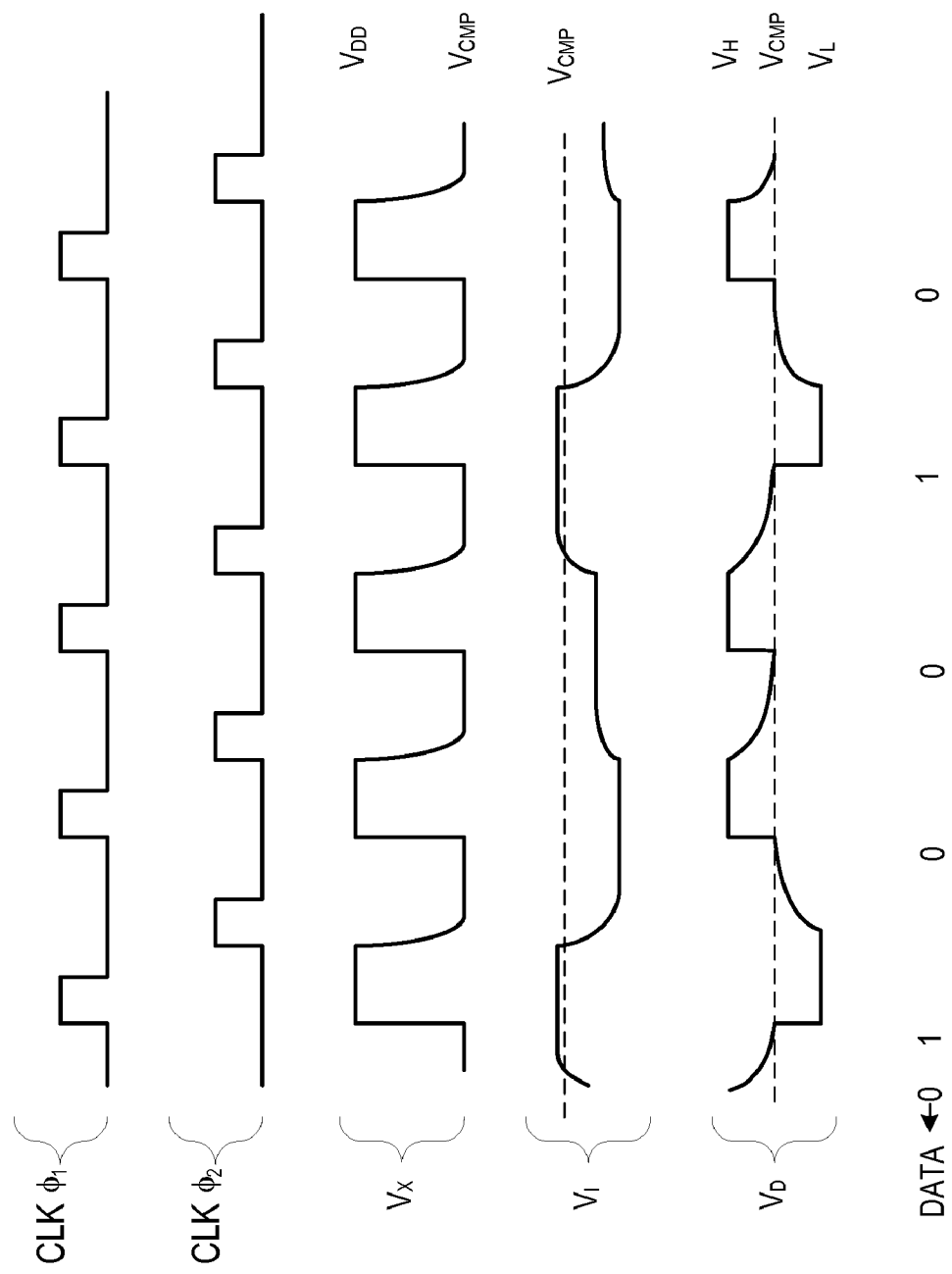
FIG. 1B is an exemplary timing diagram for the embodiment shown in FIG. 1A.

The charge held on integrating capacitance 108 is appropriately converted to a digital data stream 114 using any quantizer 110 or other analog-to-digital conversion (ADC) technique. In various embodiments, a simple comparator or input of a digital gate provides a one-bit ADC output that indicates whether the input voltage from integrating capacitance 108 is greater than or less than a reference voltage ($V_{cmp}$) 112. The one-bit ADC output is subsequently latched by a control signal, such as signal $\phi_1$ as shown in FIG. 1A-B. While the simple exemplary quantizer 110 shown in FIG. 1A provides a logic "high" or "1" output when the integrating capacitance voltage exceeds reference voltage 112, this convention is somewhat arbitrarily chosen; alternate embodiments could therefore provide a logic "low" or "0" output under such conditions without departing from the concepts described herein. The output from quantizer 110 can be sampled in any conventional manner (e.g. using a digital latch circuit 111) to maintain the data stream 114 for subsequent processing.

Output data 114 represents any set of digital outputs that may be stored, filtered (e.g. by digital filter 115), averaged, decimated and/or otherwise processed in any manner. Other embodiments may provide multi-bit resolution using multiple thresholds, cascaded ADC stages, and/or the like using conventional techniques. For example, the thresholds may be provided by more than one reference voltage (such as multiple comparison voltages $V_{cmp}$). The higher resolution output may be latched at one time or as a sequence of outputs (e.g. as a successive approximation). The digital data stream 114 provided by quantizer 110 and/or latch 111 can also be used to determine an appropriate amount of "delta" charge (also "step" charge) to be applied to integrating capacitance 108. Multiple delta capacitances of the same or different size may also be used to vary the amount of charge applied. In the exemplary embodiment shown in FIG. 1A, for example, a logic high ("1") output 114 represents the condition wherein the voltage on integrating capacitance 108 exceeds the reference voltage 112, indicating that a corresponding "delta" charge should be applied by delta capacitance 126. Accordingly, data output 114 can be used to select between "low" and "high" reference voltages 118, 120, or some quantized value between them to provide a simple digital-to-analog conversion (DAC) 116 that controls the charge applied by delta capacitance 126. Alternately, one or more data outputs 114 can control whether the charge on the delta capacitance 126 (i.e. the reference charge) is shared with (e.g. any portion transferred to) or not shared with the integrating capacitance 108. Therefore, on a particular data output 114, the charge on the delta capacitance 126 can be shared zero, one, or multiple times. Not sharing (sharing zero time) is similar to setting the DAC 116 output voltage equal to the voltage on the integrating capacitance 108, since no charge is transferred. In any case, the effective charge shared could be made negligible for a value of the data output 114. This "feedback loop" of DAC 116, switch 122, and delta capacitance 126 therefore provide the appropriate "delta" charge values to integrating capacitance 108 to counteract charge applied to integrating capacitance 108 by measurable capacitance 102. Further, because the amount of reference charge applied is a known quantity (based upon the value of delta capacitance 126 and reference voltages 118 and 120), the total amount of feedback "delta" charge applied to integrating capacitance 108 to maintain a relatively constant charge measurement of the passive network 109 can be readily determined from digital data stream 114. That is, digital data stream 114 suitably represents the number of "delta" charges applied to integrating capacitance 108, which is in turn representative of the charge received from measurable capacitance 102. By correlating (filtering) the amount of charge received from measurable capacitance 102 to the amount of voltage initially applied to generate that charge, the measurable capacitance 102 can be readily determined.

Because the diagram of FIG. 1A is intended as an exemplary logical representation rather than an actual circuit implementation of a capacitance sensor, the particular functions shown may be inter-combined, omitted, enhanced or otherwise differently-implemented in various alternate embodiments. The comparator and digital-to-analog conversion functions 110 and 116, for example, could be implemented with one or more input/output signal pins on a microcontroller or the like, and need not be implemented with a discrete or separately-identifiable circuitry as shown in FIG. 1A. Quantizer 110 can often be readily implemented without the need for additional active circuitry because many commercially-available ASIC or microcontroller products provide CMOS digital inputs, comparator or Schmitt trigger functionality, and the like for signals received on certain input pins, or allow multiplexing of pins or functions, such as ADC or DAC, within the ASIC or microcontroller, although, in some embodiments, an external multiplexer can also be used. Further, such embodiments are generally capable of performing filtering or other operations on the resulting digital data 114, thereby greatly simplifying the design of capacitance sensing circuitry through the use of sigma-delta techniques.

The particular layout of FIG. 1A incorporates a sign convention in which DAC 116 is inverting, but integrating capacitance 108 and quantizer 110 are not. While delta capacitance 126 should provide a "delta" or opposing effect on integrating capacitance 108 to the charge supplied by measurable capacitance 102, this "inversion" may be applied in any manner. That is, by adjusting the signs or magnitudes of various reference signals 104, 112, 118, 120 and/or by adjusting the configuration of the various components shown in FIG. 1A, any number of alternate but equivalent implementations could be formulated. Several examples of actual circuits suitable for sensing capacitance are described below.

The basic features shown in FIG. 1A may be operated in any manner. In one operating technique shown in FIG. 1B, two non-overlapping control signals as indicated by symbols $\phi_1$ and $\phi_2$ trigger charge transfer processes that allow charge from measurable capacitance 102 to be transferred to integrating capacitance 108, and for opposing charge from delta capacitance 126 to adjust the level of charge held by integrating capacitance 108. This transfer of charge is reflected in the series of voltage traces for $V_x$, $V_I$, and $V_D$ shown in FIG. 1B, wherein $V_x$, $V_I$, and $V_D$ are referenced across their respective capacitances 102, 108 and 126. As shown in the figure, $V_D$ is set high ("$V_H$" in FIG. 1A) in response to a low ("0") data value 114, and is otherwise left low ("$V_L$" in FIG. 1A). When switch 122 is coupled to integrating capacitance 108, the appropriate charge from delta capacitance 126 is transferred to integrating capacitance 108, thereby producing a suitable change in voltage $V_I$. After an initial startup period, the voltage $V_I$ will typically approximate the comparator voltage $V_{cmp}$, since negative feedback results in charge being added to or subtracted from the integrating capacitance 108 by the delta capacitance 126.

The range of capacitance values that can be measured is determined by $V_x$, $V_L$, and $V_H$, the value of delta capacitance 126, the number of times (N) that the delta capacitance 126 is fed back per measurement cycle, and the number of times (M) the measurable capacitance 102 is shared with the passive network 109 per measurement cycle. The measurement cycle is the period between comparisons of the charge on the passive network 109 with a threshold. To first order, the determined value of the measurable capacitance 102 (assuming that the voltage $V_I$ control to $V_{cmp}$ is maintained) is between $C_D(N/M)((V_L-V_{cmp})/(V_x-V_{cmp}))$ and $C_D(N/M)((V_H-V_{cmp})/(V_x-V_{cmp}))$. As noted above, the particular sign conventions and other specific operating parameters for FIGS. 1A-B could be modified in many alternate embodiments.

Turning now to FIG. 2 for primary reference (but with continued reference to the structural features shown in FIG. 1), an exemplary technique 200 for implementing sigma-delta capacitance sensing suitably includes the broad steps of applying a voltage to measurable capacitance 102 (step 202), allowing charge to transfer from measurable capacitance 102 to a passive network 109 that includes integrating capacitance 108 (step 204), and then adjusting the charge on the passive network (step 210) based on threshold value (step 206). Each of the various steps in process 200 are repeated an appropriate number of iterations (step 214) to allow for accurate sigma-delta measurement.

Charging step 202 suitably involves applying a known voltage to the measurable capacitance 102 using any appropriate technique. In various embodiments, a charging voltage (e.g. a low or high digital output, a power supply signal and/or the like) 104 is applied by activating a controller signal pin or other switch 106 as appropriate. It should be noted that although the various switches in converter 100 were illustrated in a particular arrangement, that this is merely exemplary of one type of arrangement. It should also be noted when "using" or "activating" a switch in the various embodiments, this "using" or "activating" can be implemented as any combination of selectively closing a switch, selectively opening a switch, or otherwise actuating the switch. Thus, a switch can be used to apply a voltage both by any combination of closing and opening depending upon the layout of the particular implementation. Furthermore, a charging voltage may be applied at least once to measurable capacitance 102 in one or more pulses (e.g. by repetitively engaging and disengaging switch 106), or through any other technique.

After charging, measurable capacitance 102 is allowed to share charge with a passive network 109 capable of approximately integrating and storing charge without amplifiers or other active elements. In a simple embodiment, the passive network 109 is simply integrating capacitance 108, which can be a single capacitor; alternatively, the passive network 109 may contain any number of resistors, capacitors and/or other passive elements as appropriate, and a number of examples of passive networks are described below. To allow measurable capacitance 102 to share charge with the passive network, no action may be required other than to pause (e.g. while not charging the measurable capacitance) for a time sufficient to allow charge to transfer. In various embodiments, the pause time may be relatively short (e.g. if the integrating capacitance 108 is connected directly to the measurable capacitance 102), or some delay time may occur (e.g. for charge to transfer through a passive networks 109 having one or more resistive elements placed between the measurable capacitance 102 and the integrating capacitance 108). In other embodiments, allowing charge to transfer may involve actively actuating one or more switches (e.g. switch 106 in FIG. 1) or taking other actions as appropriate. In various embodiments, steps 202 and/or 204 can be repeated two or more times before taking further action.

It should be noted that although the measurable capacitance 102 may be statically coupled to the integrating capacitance, charge sharing between capacitances can be considered to substantially begin when the charging step 202 ends (e.g., when The applying of voltage to The measurable capacitance ends). Furthermore, the charge sharing between capacitances can be considered to substantially end when the voltages at the capacitances are similar enough that negligible charge is being shared. Charge sharing can also substantially end with the next application of a voltage because the (e.g. 104 charging) voltage being applied dominates. Thus, even in a passive sharing system where the integrating capacitance is always coupled to the measurable capacitance, the low impedance of the applied voltage source makes the charge on the measurable capacitance that would be shared negligible until the applied voltage is removed.

When charge from measurable capacitance 102 is effectively transferred to the passive network 109, the charge on the passive network 109 is appropriately measured (step 206), and changed (step 210) if the amount of charge is determined to be past a suitable threshold value (step 208). Charge measurement may take place in any manner. In various embodiments, the voltage on passive network 109 representative of that charge is obtained from an input/output (I/O) pin of a microcontroller or other device. In many such embodiments, circuitry associated with the input pin is also capable of performing an analog-to-digital (A/D) conversion or of comparing the measured voltage to one or more threshold voltages $V_{TH}$, thereby effectively performing both steps 206 and 208. The particular threshold value $V_{TH}$ (e.g. reference voltage 112, represented by the $V_{cmp}$ provided to quantizer 110 in FIG. 1) may vary significantly by embodiment and may vary slowly with time. In a simple embodiment, a CMOS digital input acts as a comparator (1-bit quantizer) with a reference voltage equal to the threshold level of the digital input. The connection of the quantizer 110 and the passive network can be direct or may be through a multiplexer or other switching network.

In the case where the input has hysteresis, such as in a Schmitt trigger, it is often useful to ensure that the hysteresis is set to a known state before comparison of the measured voltage, thus providing a similar threshold for all comparisons. Alternately, setting the hysteresis to a known state may be used to reliably select between thresholds on different comparisons. This may be accomplished by simply setting the input prior to the comparison to a value known to set the hysteresis state.

As the charge on the passive network 109 passes an appropriate threshold value, a "delta" charge that opposes the charge shared from the measurable capacitance 102 is applied (e.g. via delta capacitance 126 in FIG. 1) to change the charge on the passive network 109 (step 210) using conventional sigma-delta techniques such as those described above. In many embodiments, the charge on the passive network 109 may also be modified (albeit by a different amount than applied in step 208) when the charge has not passed the threshold value (step 211), although this feature is not necessary in all embodiments. Where there are multiple thresholds, different amounts of charge may be fed back. Note that in different states within a repetition of the steps of a charging cycle the charge transfer through various capacitances (e.g. measurable capacitance, delta capacitance, integrating capacitance) may change direction, but the net charge transfer in the cycle is referred to here. In this manner, the charge on passive network 109 can be maintained to what is needed for the associated voltage on passive network 109 to approximately equal the threshold value ($V_{TH}$), if the measurable capacitance 102 is within range. That is (with momentary reference again to FIG. 1) because the output of quantizer 110 is fed back via the delta capacitance 126 in a net negative feedback system, the voltage across the integrating capacitance 108 remains approximately constant during operation due to the control loop.

The quantized (e.g. digital) values measured in step 206 and/or any quantity derived therefrom (e.g. a count of "high" or "low" values contained within a particular period of time) can be readily stored in a memory as quantized data and digitally filtered or otherwise processed as appropriate (step 212). Various filters have been successfully implemented in conjunction with sigma-delta measurement techniques, including conventional digital finite impulse response (FIR) filters such as triangle filters, averaging filters, and Kaiser filters, as well as infinite impulse response (IIR) filters.

The voltage application, charge transfer, charge changing and/or other steps may be individually and/or collectively repeated (step 214) any number of times to implement a number of useful features. For example, by obtaining multiple quantized values of measurable capacitance 102, the measured values can be readily decimated, filtered, averaged and/or otherwise digitally processed within the control circuitry to reduce the effects of noise, to provide increasingly reliable measurement values, and/or the like. A number of these features are described below.

One advantage of many embodiments is that a versatile capacitance sensor can be readily implemented using only passive components in conjunction with a conventional digital controller such as a microcontroller, digital signal processor, microprocessor, programmable logic array, application specific integrated circuit and/or the like. A number of these products are readily available from various commercial sources including Microchip Technologies of Chandler, Ariz.; Freescale Semiconductor of Austin, Tex.; and Texas Instruments Inc. (TI) of Dallas, Tex. Many of the control circuits described herein contain digital memory (e.g. static, dynamic or flash random access memory) that can be used to store data and instructions used to execute the various sigma-delta processing routines described herein. Process 200, for example, may be readily implemented using computer-executable instructions executed by one or more control circuits as described herein.

FIGS. 3-8 show several exemplary embodiments of sigma-delta capacitance sensors implemented using integrated control circuitry and simple passive networks made up of capacitors and/or resistors. Any of these embodiments may be supplemented or modified in myriad ways to create any number of alternate embodiments.

Figure 3B:
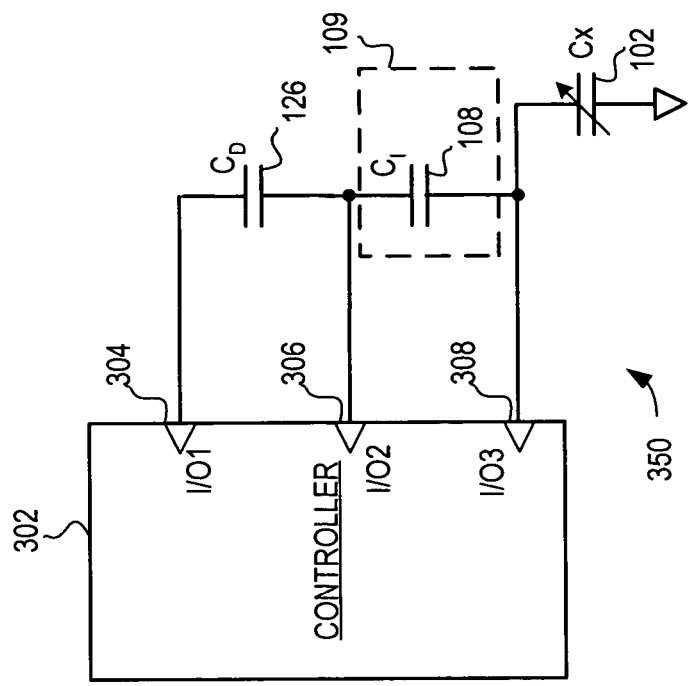
FIGS. 3A-B are diagrams of exemplary sigma-delta capacitance detecting circuits implemented with passive networks and three digital input/output pins of a controller.
Figure 3A:
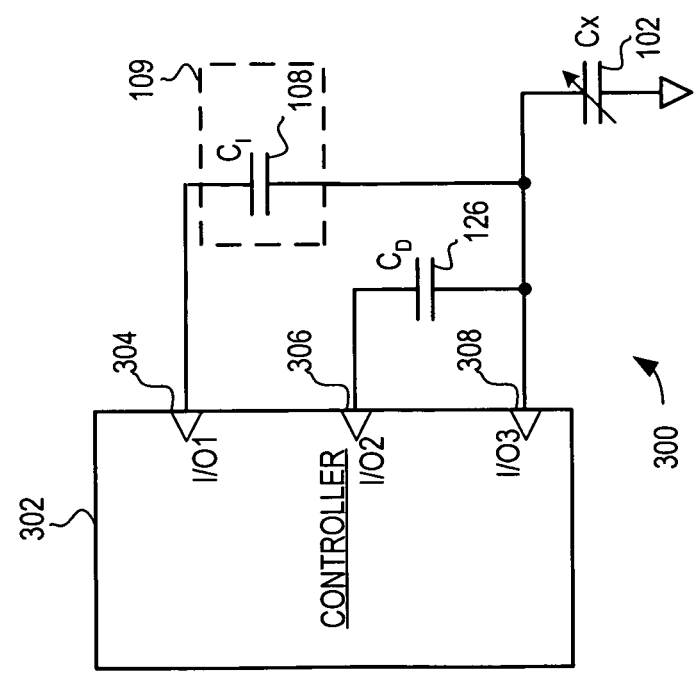

With reference now to FIG. 3A, an exemplary capacitance sensor 300 suitably includes a controller 302 with at least three input/output signal pins (I/Os) 304, 306 and 308 and their associated circuitry within controller 102 acting as switches to power and ground (or other reference values as appropriate). In the FIG. 3A example, $I/O_3$ (pin 308) is coupled to measurable capacitance 102, and the other two pins $I/O_1$ (pin 304) and $I/O_2$ (pin 306) are coupled to a passive network 109, comprising integrating capacitance 108, which is charged through measurable capacitance 102 and discharged through delta capacitance 126, or vice versa. Integrating capacitance 108 is generally selected to exhibit a much greater capacitance than that expected of measurable capacitance 102, and delta capacitance 126 is selected to set the maximum measurable capacitance. Again, the particular capacitance values and relationships may vary according to the particular embodiment, as may the particular arrangement of the signal pins and passive network 109 components. FIG. 3B, for example, shows a "series" configuration of a three-pin, two-capacitor sensor 350 that operates in a manner similar to the "parallel" arrangement shown in FIG. 3A.

In the various embodiments, hardware, software and/or firmware logic within controller 302 appropriately sequences and controls the sigma-delta measurement process by controlling signals placed and received on input/output (I/O) pins 304, 306, and 308. In an exemplary operation, controller 302 suitably samples the charge on integrating capacitance 108 by measuring the voltage on pin 308. In other implementations the voltage might be measured on other nodes. This voltage, which corresponds to the input of quantizer 110 in FIG. 1A can be quantified in many embodiments using a digital input threshold, an on-board ADC, or a Schmitt trigger input available within controller circuit 302. In other embodiments, analog comparator circuitry for comparing the voltage on pin 308 to a suitable reference value 112 (FIG. 1A) may be provided. Although conventions for data representation may vary with different embodiments, voltages on integrating capacitance 108 greater than a threshold value (of pin 308) can be associated with one logic value (e.g."1"), and voltages less than a threshold value can be associated with another logic value (e.g."0"). These quantized data are appropriately stored (see step 212 above) for subsequent processing. Note that if an input with hysteresis, such as a Schmitt trigger input, is used as quantizer 100, states 0 and 1 of the methodology shown leave the hysteresis in a known state on signal pin 308.

Figure 3D:
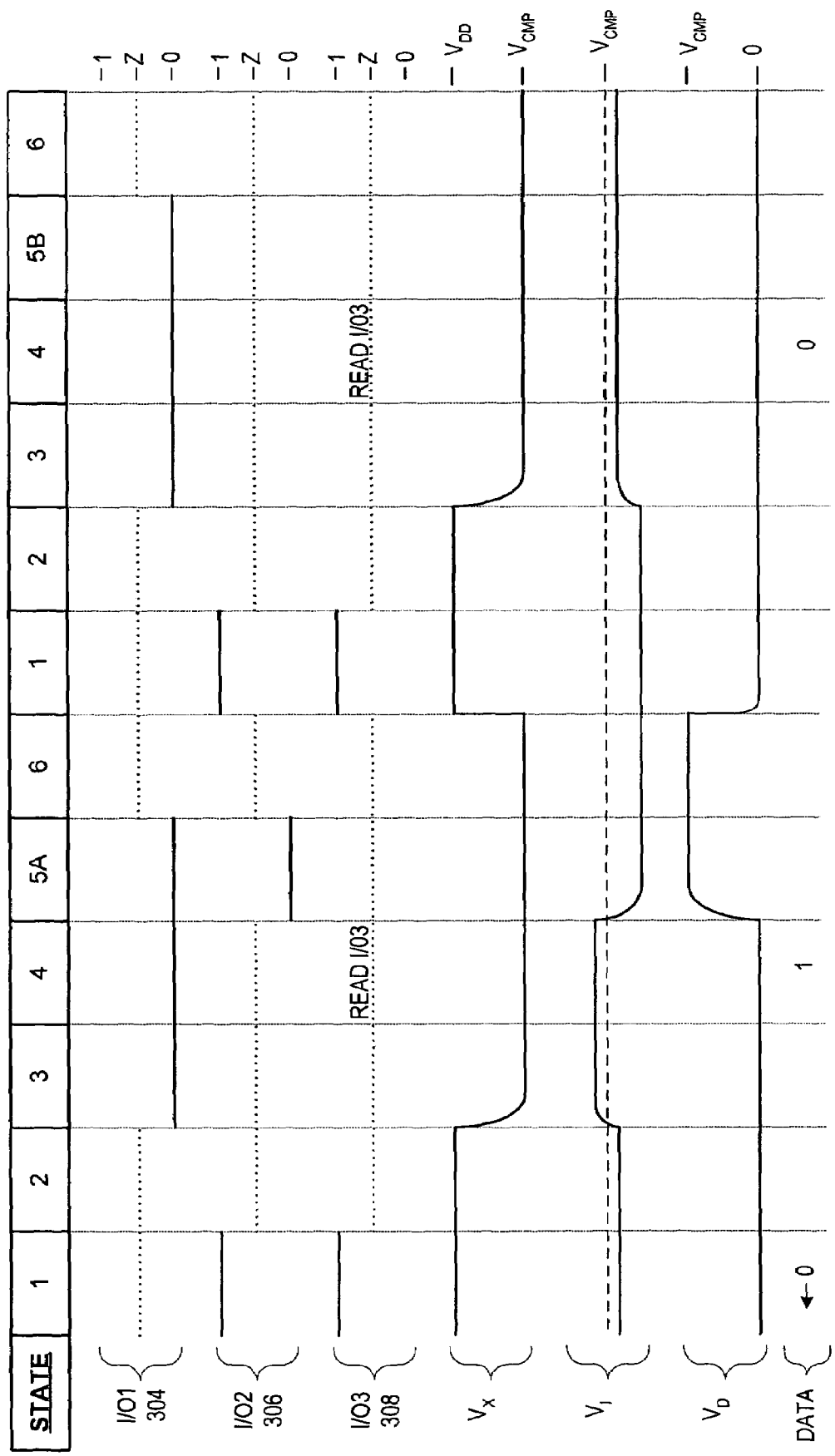

An exemplary technique for operating the sensor circuit 300 of FIG. 3A is illustrated in FIGS. 3C-D. To control the operation of the passive network 109, a substantially constant charging voltage (e.g. from a battery, a power supply voltage such as $V_{DD}$, or other reference voltage) is initially applied to measurable capacitance 102 for a substantially constant length of time, illustrated as "State 1" in FIGS. 3C-D. Signal pin 306 is also driven to the same charging voltage to remove any charge held on delta capacitance 126. The charge applied to measurable capacitance 102 can then be isolated on measurable capacitance 102 by placing pins 306 and 308 into an intermediate high impedance or "open circuit" state, as indicated in "State 2". This intermediate state represents the non-overlapping switch states, although the technique could also be accomplished without an explicitly separate state. Other transitions might also be managed with other intervening high impedance states. The charge is subsequently shared from measurable capacitance 102 to passive network 109 by applying a logic state voltage on pin 304 that is opposite to the state of the charging voltage (e.g. by applying a "low" state if the charging voltage is "high", and vice versa) in State 3.

In the above technique, when circuit 300 approaches steady state, the voltage on integrating capacitance 108 (referenced to pin 304) should remain roughly constant and approximately equal to the threshold voltage of pin 308 (e.g. $V_{TH}$ of the associated I/O). The voltage at the signal pin 308 similarly remains relatively close to the threshold of input pin 308 when signal pin 304 is driven low. The output of the quantizer (signal pin 308), then, when sampled in State 4, is a measure of the charge on integrating capacitance 108. Depending on the sampled output of the quantizer (from the associated input of signal pin 308), State 5 changes the charge on integrating capacitance 108. If the sampled output of the quantizer (signal pin 308), exceeds the threshold, state 5A removes charge from the integrating capacitance 108; otherwise, no (or negligible) charge is removed (state 5B). After the delta-charge is placed (changing the charge on the integrating capacitance 108 of passive network 109) or skipped, signal pin 308 can be placed into a high-impedance state to trap charge on passive network 109 for a subsequent sampling on pin 308 (State 6). When quantized data has been obtained and stored, the data may be filtered, decimated or otherwise processed as appropriate to determine a value of the measurable capacitance 102. In the case where the quantizer (e.g. signal pin 308) has hysteresis, State 1 had set the input high, so the lower threshold of the hysteresis determines the output;

In an alternate embodiment, where integrating capacitance 108 is discharged through measurable capacitance 102 and charged through delta capacitance 126, the charge is changed when it falls below the quantizer threshold. In other variations, positive or negative charges may be shared with integrating capacitance 108 though measurable capacitance 102 and delta capacitance 126, though no charge may be shared, and other nodes (e.g. pin 304 of FIG. 3A) may be used for threshold measurement.

Figure 4B:
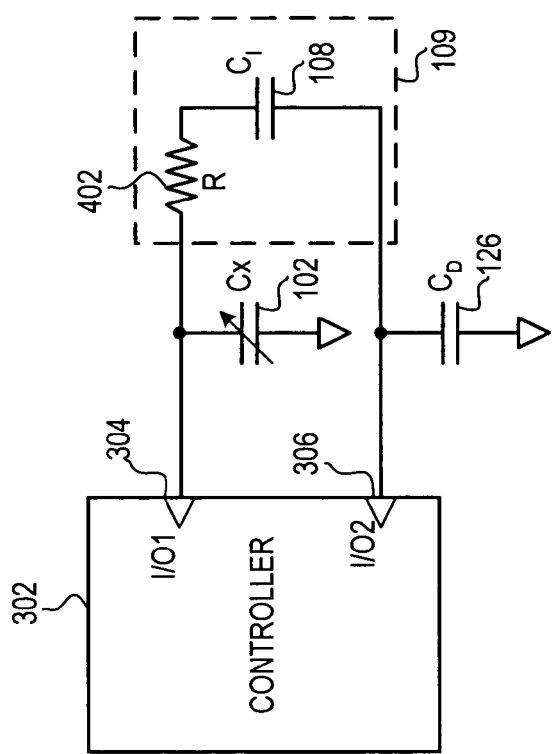
FIGS. 4A-B are diagrams of exemplary sigma-delta capacitance detecting circuits implemented with passive networks and two digital input/output pins of a controller.
Figure 4A:
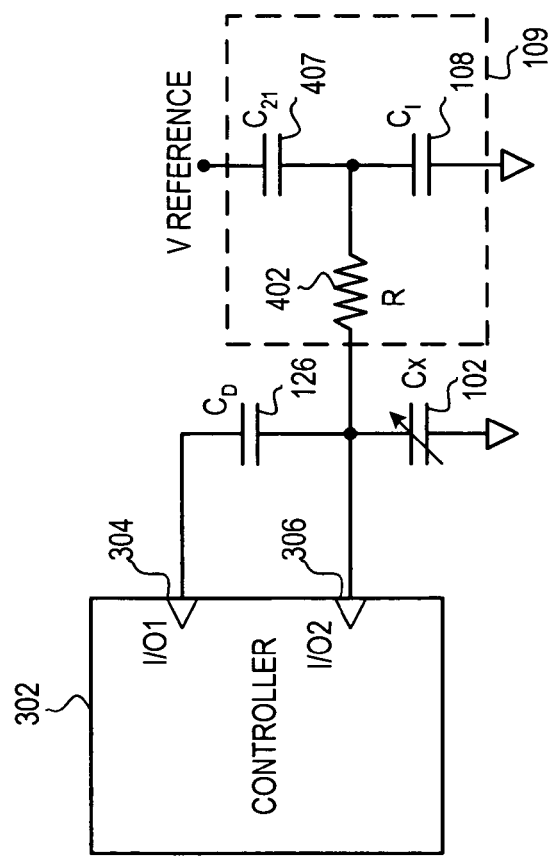
Figure 9B:
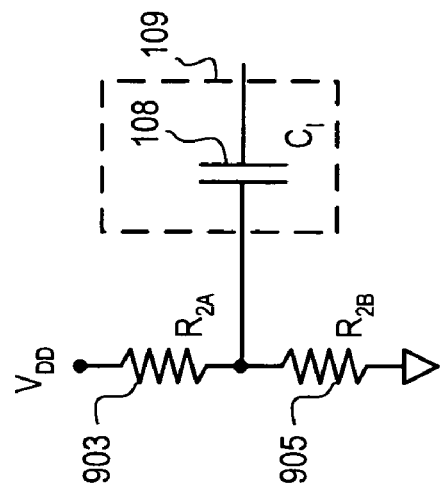
FIGS. 9A-B are circuit diagrams of exemplary topologies for reducing the effects of power supply noise in a capacitance detecting system.
Figure 9A:
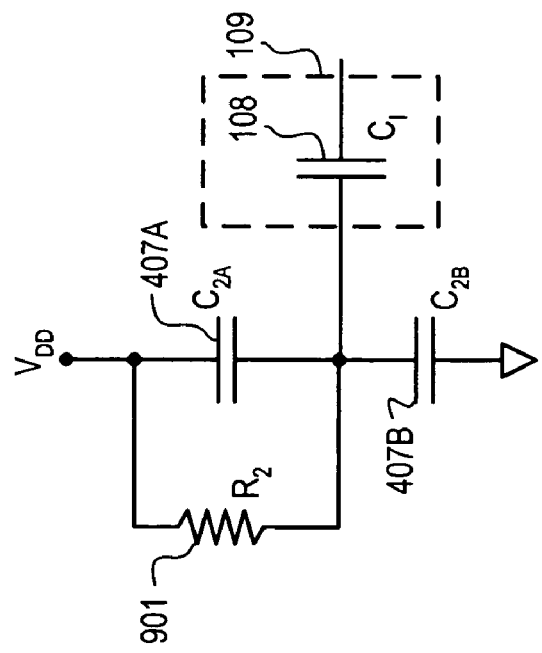

FIGS. 4A-B show similar implementations that allow sigma-delta sampling with only two signal pins 304 and 306 on controller 302. In the FIG. 4A implementation 400, the passive network 109 suitably includes an integrating capacitance 108 in series with an isolating resistor 402 coupled to the measurable capacitance 102 and to signal pin 306. The FIG. 4A implementation also includes a delta capacitance 126 coupled to signal pins 304 and 306. The FIG. 4A implementation (and others) can also optionally include a second capacitance 407 between a power supply voltage and the isolating resistor 402 to increase power supply noise rejection. The second capacitance 407 is selected so noise on the power supply couples to node 403 in the same ratio as noise on the power supply couples to the threshold(s) of the quantizer generically presented as 110 in FIG. 1A. Other topologies for reducing the effects of power supply noise are possible, and two examples are shown in FIGS. 9A-B. FIG. 9A shows a resistor 901 in parallel with the capacitance 407A and in series with capacitance 407B coupled to one or more integrating capacitances 108. FIG. 9B shows two resistors 903, 905 forming a voltage divider coupled to one or more integrating capacitances 108 and no discrete second capacitance. Including second capacitance 407A,B or utilizing an alternative such as one of those shown in FIGS. 9A-B is especially useful for systems with multiple integrating capacitances 108. Although only one integrating capacitance 108 is shown in conjunction with second capacitance 407A,B and alternatives, multiple integrating capacitances can share the same node. The FIG. 4B "series" variation of 400 shows a passive network 109 comprising an isolating resistor 402 separating the measurable capacitance 102 from the integrating capacitance 108.

In both of these embodiments, measurable capacitance 102 is charged with charging pulses that are short enough to be substantially blocked by the RC time constant created by integrating capacitance 108 and isolating resistor 402. The charging pulse is preferably also shorter than the RC time constant of the measurable capacitance and the isolating resistor as well. This allows charging of measurable capacitance 102 and measurement of the voltage on integrating capacitance 108 to take place using the same pin. In both embodiments, the voltage measured on either signal pin 304 or pin 306 can determine whether charge from delta capacitance 126 is to be shared with integrating capacitance 108. In the FIG. 4A embodiment, signal pin 306 is used to apply the charging voltage to measurable capacitance 102 and signal pin 304 is used to apply a charging voltage to delta capacitance 126. The FIG. 4B embodiment differs, and signal pin 306 is used to apply a charging voltage to delta capacitance 126 to change the charge on integrating capacitance 108, and signal pin 304 is used to apply the charging voltage to measurable capacitance 102. Note that in the FIG. 4B embodiment, it is simple to share charge from the measurable capacitance 102 to integrating capacitance 108 multiple times without sharing from the delta capacitance 126, or to share charge from the delta capacitance 126 to integrating capacitance 108 multiple times without sharing charge from the measurable capacitance 102.

In many of these implementations a "current canceling" voltage may precede the charging voltage. The timing of the "current canceling" voltage is controlled so the amount of "parasitic" charge removed through isolating resistor 402 in state 0 is mostly equal to the amount of "parasitic" charge added to integrating capacitance 108 through isolating resistor 402 in state 1, and the measurable capacitance 102 is left at the proper charging voltage before sharing with the passive network 109. This may allow for lower impedances in passive network 109, such as a lower value for isolating resistor 402, and faster time constants for passive network 109 as a whole without changing the measurable capacitance charge timing requirements.

Measurable capacitance 102 shares charge with integrating capacitance 108 through isolating resistor 402. Because of the RC time delay created by the resistor, this embodiment may consume more time for sharing charge than the three-pin embodiment described with respect to FIG. 4. Nevertheless, by reducing the number of switches/logic pins used to implement the sensor, additional sensing channels can be provided on a common chip, thereby allowing for improved efficiency in some embodiments.

The exemplary circuits shown in FIGS. 4A-B may be modified in many ways to implement any number of additional features. In embodiments wherein controller 302 has relatively accurate timing, for example, delta capacitance 126 may be replaced with a conventional resistor, and "delta" charge may be applied to integrating capacitance 108 by simply activating pin 304 (pin 306 in FIG. 4B) for a pre-determined period of time. Moreover, isolating resistor 402 may be useful in reducing the effects of any hysteresis present in the ADC feature of signal pin 306.

Figure 4D:
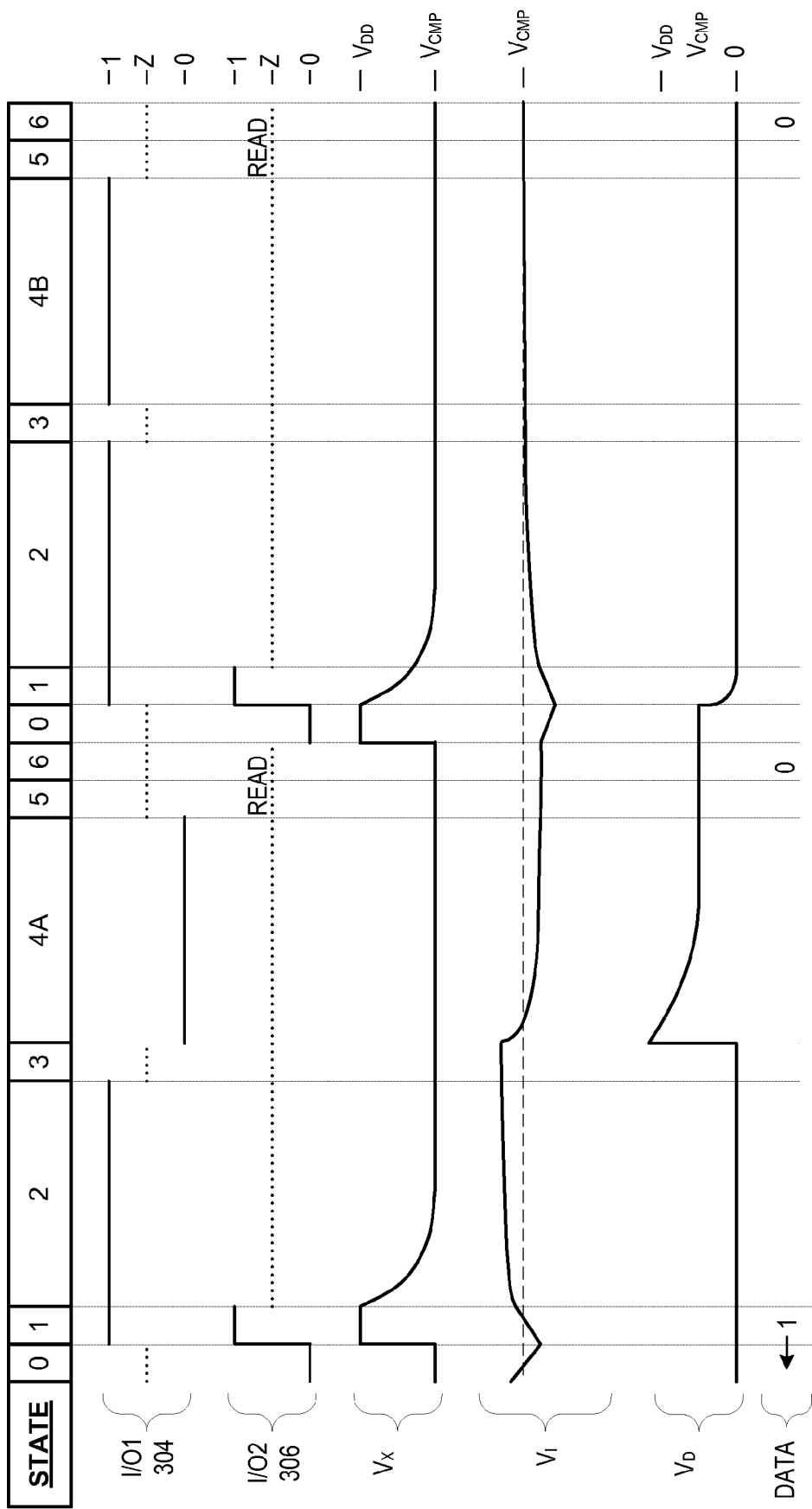

One technique for operating circuit 400 shown in FIG. 4A is illustrated in the state diagram of FIG. 4C and the timing diagram of FIG. 4D. With reference to these figures, the process of detecting the level of measurable capacitance 102 optionally begins by placing signal pin 306 into a known (e.g. logic low) state (State 0). Because isolating resistor 402 creates an RC time constant with integrating capacitance 108, pin 306 (pin 304 in FIG. 4B) may be placed into a known state (e.g. a logic low state) prior to each read cycle for a brief period of time without significantly affecting the amount of charge stored on integrating capacitance 108. By placing signal pin 306 into a known state for even a brief moment prior to sampling the charge on integrating capacitance 108, the amount of hysteresis on pin 306 is known, and can be compensated within controller 302. If the timing of states 0 and 1 is controlled, then the parasitic charge that flows through resistor 402 onto integrating capacitance 108 during those states can also be minimized.

The measurable capacitance 102 is then charged and delta capacitance 126 is cleared by placing both pins 304 and 306 into a known (high) logic state, as shown in State 1. Charge is subsequently trapped on the measurable capacitance by bringing pin 306 to a high impedance state (State 2), and sufficient delay time is subsequently allowed for charge to share (e.g. charge or discharge) from measurable capacitance 102 to integrating capacitance 108 through isolating resistor 402. After charge is shared from measurable capacitance 102, "delta" charge from delta capacitance 126 is applied or not applied based upon the voltage measured on integrating capacitance 108 (in the previous State 6). In the example shown, the voltage level used in determining whether "delta" charge is applied was obtained from a prior iteration of the sigma-delta process. In other embodiments, voltage may be measured (e.g. State 3) just prior to application and sharing of "delta charge," or at other points in the detection process.

Figure 5A:
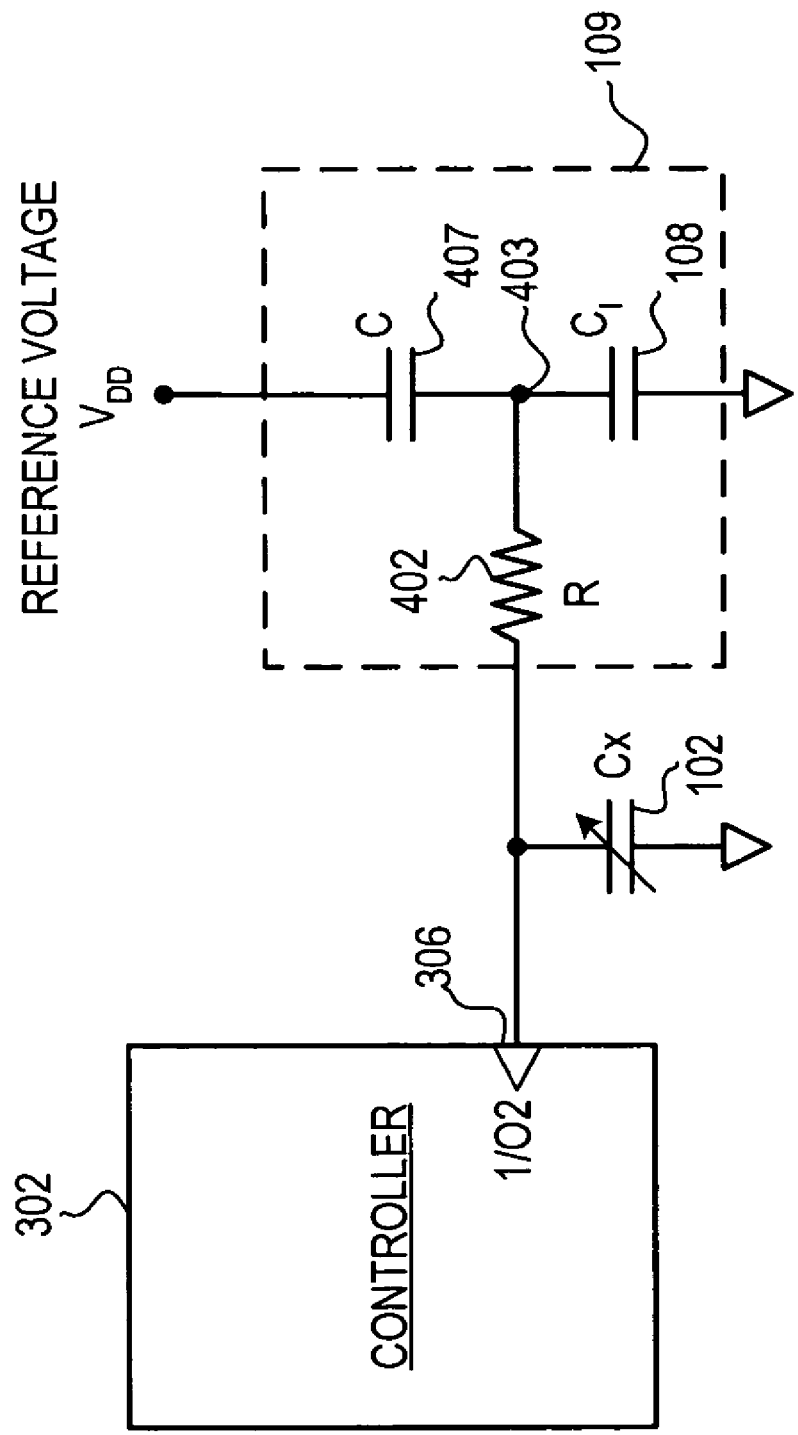
FIG. 5A is a diagram of an exemplary sigma-delta capacitance detecting circuit implemented with a passive network and one digital input/output pin of a controller.

Even further reductions in signal pin usage can be realized using the sensor 500 shown in FIG. 5, in which measurable capacitance 102 and a passive network 109 composed of integrating capacitance 108 and isolating resistance 402 are coupled to a single signal pin 306 of controller 302. Similar to the FIG. 4A implementation, the FIG. 5A implementation can also optionally include a second capacitance 407 between a power supply voltage and the isolating resistance 402, or an alternative such as one of the circuits shown in FIGS. 9A-B to increase power supply noise rejection. In this embodiment, measurable capacitance 102 is again charged with voltage pulses that have periods less than the RC time constant created by isolating resistance 402 and integrating capacitance 108 to reduce or eliminate adverse effects upon the charge stored on integrating capacitance 108. Measurable capacitance 102 discharges through isolating resistance 402, as described above, and "delta" charge is applied to integrating capacitance 108 by placing a discharging voltage on pin 306 to drive current through isolating resistance 402 for a known period of time. Because sensor 500 includes an isolating resistance 402 as described above, compensation for hysteresis on pin 306 can be similarly applied by placing the pin in a known state prior to sampling it. Parasitic currents through resistance 402 during states 0 and 1 can also be minimized by controlling the timing of the charging voltage, and the "current canceling" voltage.

Figure 5C:
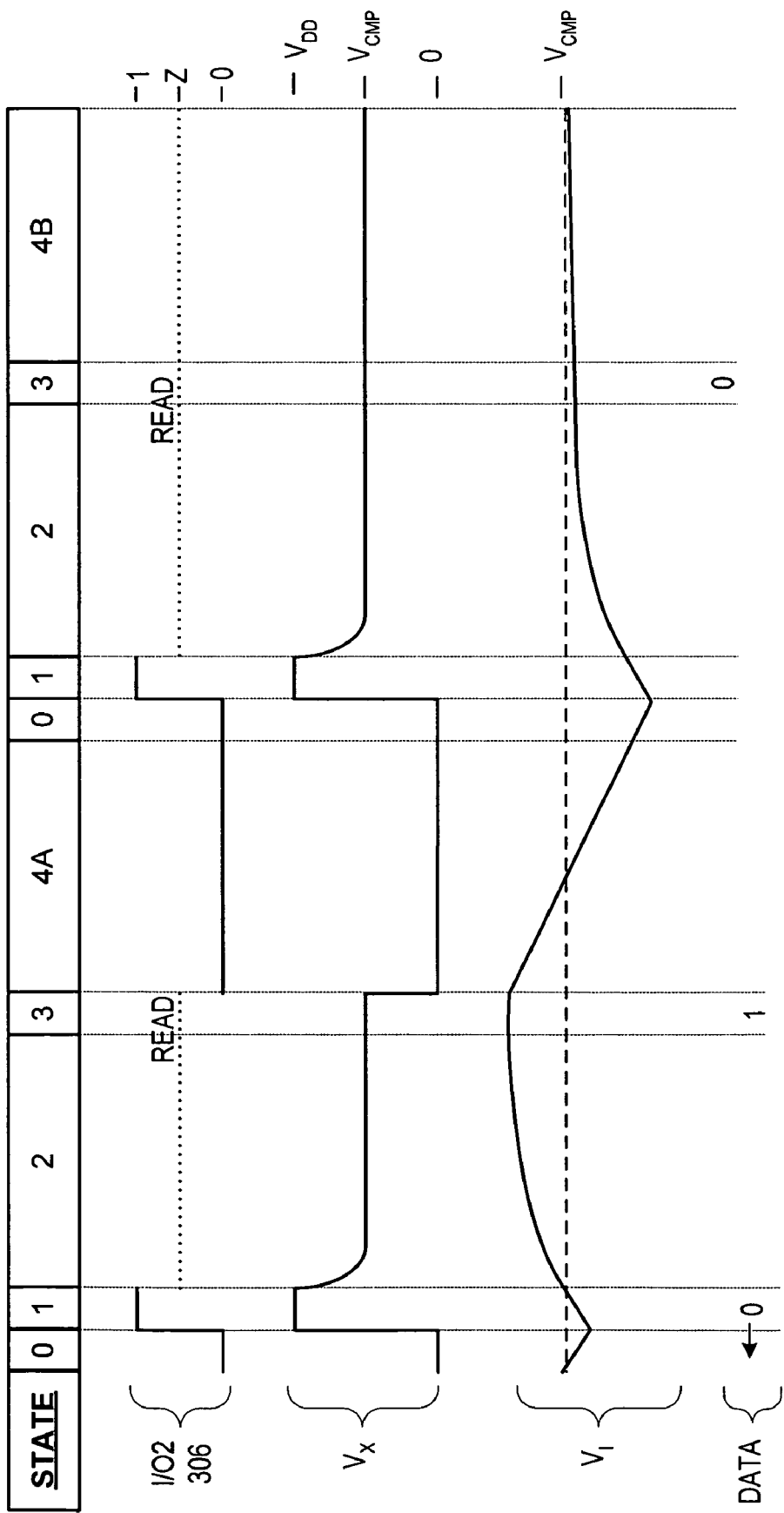

An exemplary technique for operating such a circuit is illustrated in FIGS. 5B and 5C. With reference to those figures, pin 306 is optionally set to provide a "current cancelling" voltage (e.g. ground) preceding the charging voltage; the length of the "current cancelling" voltage is chosen so the amount of parasitic charge removed is mostly equal to the amount of parasitic charge added by the charging pulse. By subsequently applying voltage pulses having a relatively short duration (compared to the RC time constant of the network), measurable capacitance 102 can be charged (State 1), then allowed to share charge through isolating resistance 402 to integrating capacitance 108 (State 2). After sufficient time for charge sharing has elapsed, the charge can be measured by sampling the voltage on pin 306 (State 3), and "delta" charge can be applied (or not applied) to integrating capacitance 108 as appropriate (State 4) based upon the measured voltage. Again, "delta" charge is simply applied in this embodiment by applying an appropriate voltage on signal pin 306 for an appropriate time to produce the desired change in charge on integrating capacitance 108.

Figure 6B:
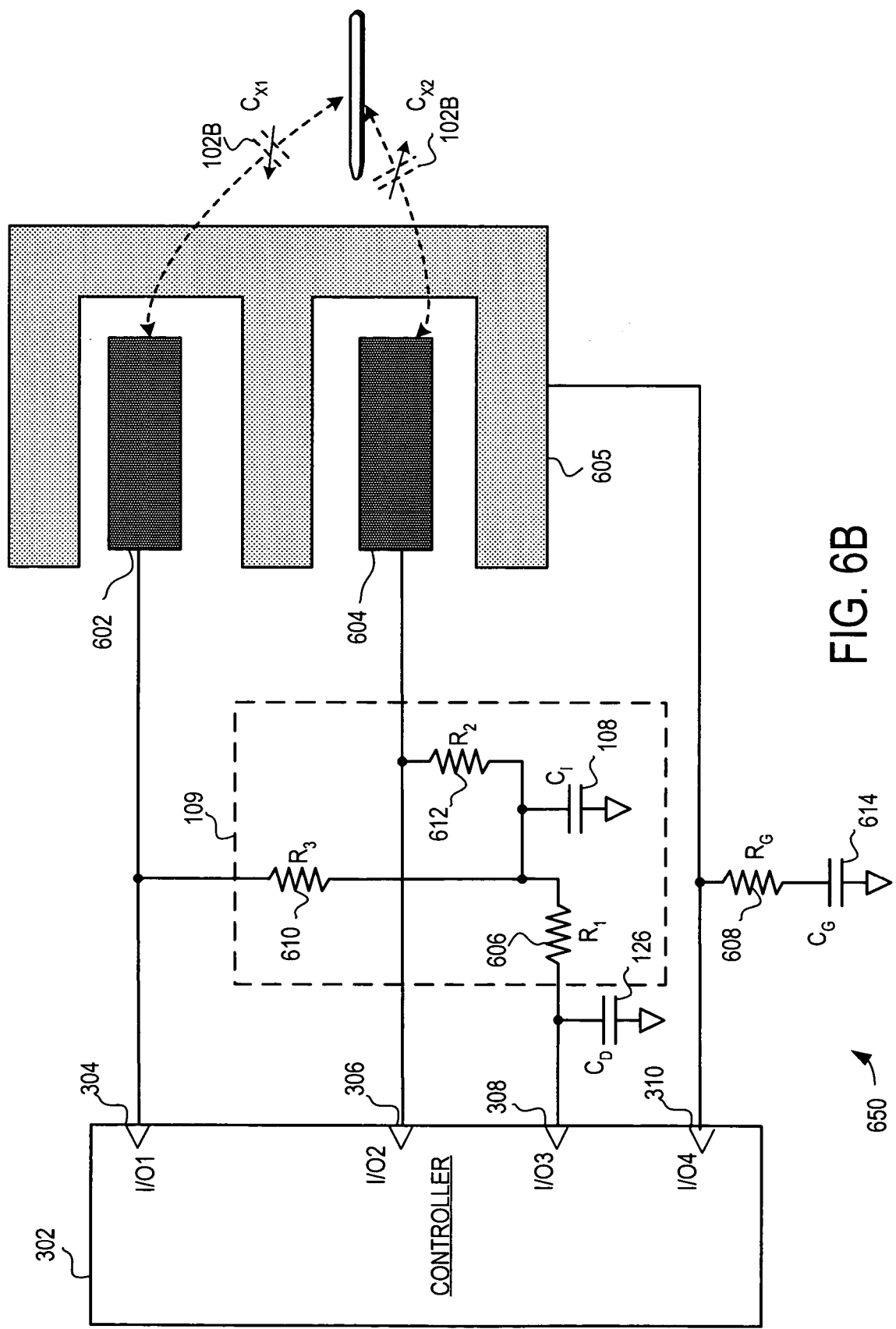

The general structures, concepts and techniques described above may be modified or supplemented in many different ways, and may be exploited in many different yet equivalent embodiments. FIGS. 6A-B, for example, show two examples of circuits capable of sensing capacitance on multiple channels using the techniques shown above. With reference now to FIG. 6A, an exemplary two-channel position sensor 600 is shown with two sensing electrodes 602, 604 that each correspond to a measurable capacitance 102 in the discussion above. As a finger, stylus or other object approaches either electrode 602, 604, the capacitances of that node change in a manner that can be correlated to the presence of the object. Stated another way, the presence of an object in proximity or in contact with either electrode 602, 604 can be determined by measuring the capacitance of that electrode channel.

The sensing scheme used in each channel (A and B) of sensor 600 generally parallels the two-pin sensor 400 described in conjunction with FIG. 4A above. Alternate embodiments could of course use any of the other techniques described or referenced herein. In the exemplary embodiment of FIG. 6A, then, voltage is applied to electrodes 602 and 604 via pins 306 and 310, respectively, of controller 302. Each electrode 602, 604 is allowed to share charge with an integrating capacitance 108A, 108B through an isolating resistance 408A, 408B (respectively). Levels of charge maintained on each integrating capacitance 108A-B are then sampled by quantizing the voltage at signal pins 306 and 310, with any necessary"delta" charge from delta capacitance 126A-B being applied through manipulation of signal pins 304 and 308 to change the charge on the associated integrating capacitance.

Even further, the symmetry of the sensing channels enables embodiments with shared components. For example, any integrating capacitances, delta capacitances, and/or resistances required can be shared between multiple sensor channels. One exemplary embodiment is shown in FIG. 6B. This use of shared components can reduce the cost and size of the overall system significantly. Indeed, various techniques can be implemented for sharing signal pins on controller 302 and/or any discrete components within the passive network 109 across a wide array of alternate embodiments.

By implementing multiple sensing channels on a common controller 302, a number of efficiencies can be realized. Frequently, sensing electrodes for measurable capacitances and other electrodes for delta capacitances can be readily formed on standard printed circuit boards (PCB), so duplication of these elements is relatively inexpensive in a manufacturing sense. Certain components such as integrating capacitance 108 and isolating resistance 402, however, can be large enough to warrant discrete components. Similarly, where the accuracy of the delta capacitance is a concern it may be implemented as a discrete component as well. In some embodiments, one or more isolating resistances 402 may be formed on a PCB using an ink process or the like where conductive ink has higher resistance than typical materials used in PCB processes. This may be sufficient in many embodiments because the exact value of isolating resistance 402 does not typically directly affect the accuracy or the performance of the system. And in a case where the measurable capacitance 102 is relatively small, then integrating capacitance 108 may also be manufacturable in a PCB, such as through the use of a polyimide flexible printed circuit or the like. As a result, many of the various features described above can be readily implemented using conventional manufacturing techniques and structures. Moreover, the total number of signal pins required and the number of components in the passive network 109 can be even further reduced through any sort of time, frequency, code or other multiplexing technique.

Arranging the sensing electrodes 602, 604 in any number of conventional patterns allows for many diverse types of sensor layouts (including multi-dimensional layouts found in one, two or more-dimensional touchpad arrays) to be formulated. Alternatively, multiple "button"-type touch sensors can be readily formed from the various channels, or any number of other sensor layouts could be created.

Further, the various sigma-delta sensing techniques described herein, coupled with the ease of multi-channel integration, provide for highly efficient application of guard signals. The connection of multiple sensor channels associated with sensor electrodes 602, 604 to a common controller 302 allows a guard signal applied to a guard electrode 605 while signal channels are being sensed. Generally speaking, it is desirable to isolate each sensor electrode 602, 604 from undesired electrical signals, including other signals spuriously received from other electrodes and from outside sensor 600, 650. Because each of the channels within sensor 600 can be easily implemented with common reference and logic voltages, it can be readily assumed that the typical voltage values observed on the various sensor electrodes 602, 604 will be roughly identical to each other averaged over time. By applying a guard signal from a low impedance source to the various electrodes during otherwise inactive periods, then, the amount of spurious effect can be reduced. In fact, a single guard signal could be effective for all sensor electrodes with a similar sensing electrode voltage swing.

A low impedance voltage source dominates other coupled signals at a node, just as the low impedance leg of a voltage divider (or more generically an impedance divider) dominates over the higher impedance leg. That is to say that a collection of voltage sources can be approximated as single Thevenin impedance and single Thevenin voltage dominated by the lowest impedance element, if that lowest impedance is substantially less that the parallel impedance of all other sources. For the purposes of this example the output impedance of a reference voltage, signal pin output, switch, or I/O output will have sufficiently low impedance at that node that other sources are insignificant at the range of frequencies considered. Similarly, a node coupled to one near side of the integrating capacitance has sufficiently high capacitance (and low impedance) that it dominates other capacitively coupled sources, when the other far side of the integrating capacitance is driven with a low impedance (e.g. reference voltage etc.). That is the integrating capacitance can set the voltage at and absorb the majority of the charge from other higher impedance sources at the near end, when the far end is driven with a low impedance source. Clearly, the dominant impedance in a network also depends on the time period (or frequency) considered. So at long time scales (e.g. sharing) a resistance in series with the integrating capacitance may not change the integrating capacitance's status as the dominant low impedance element, while at short time scales (e.g. charging) the impedance of the measurable capacitance on the node may dominate due to that series resistance. By actuating a switch at the proper node and proper rate the dominant low impedance element can be selected, and charge directed appropriately.

Although guarding techniques are optional and vary significantly from embodiment to embodiment, one technique involves applying a guarding voltage to the guarding electrode 605 that is approximately equal to the voltage applied to the active electrode (e.g. electrode 602 or 604) during the charging period. Before the end of charge transfer from the active sensor electrode to the associated integrating capacitance (e.g. capacitance 108A or 108B for sensor 600 and capacitance 108 for sensor 650) (step 204 in FIG. 2), the voltage applied to the guarding electrode 605 is changed to be approximately equal to the voltage on the active sensor electrode and the associated integrating capacitance (The active sensor electrode and the associated integrating capacitance will typically approach the same voltage as charge sharing occurs). A threshold voltage of an associated quantizer (e.g. signal pin, I/O on the same component) may be used to control the guard voltage as a proxy for the voltage on the associated integrating capacitance of a sensing channel in systems such as the one shown in FIG. 6B, if the threshold voltage of the quantizer is approximately equal to the voltage on the associated integrating capacitance when the feedback loop is in control (i.e. approximately $V_{CMP}$). Alternately, an impedance divider may be used to reduce power supply variation sensitivity when the impedance divider output sensitivity is ratioed to the power supply similarly to the quantizer threshold sensitivity; an example of this impedance divider is shown by the voltage divider formed by resistances 606, 608 in FIG. 6A. In another implementation, the guard swing (and the charge transferred from the guard electrode) could change from one repetition of the charge transfer process to another (the charge transfer process includes the applying step, the allowing step, and the changing step). This guard voltage swing could average to the same voltage swing as on the sensing electrodes. If the change in guard swing involves having a guard swing of zero in some cases and a constant value in the other cases, this enables a pulse-code modulated guard technique that does not require any extra components. An offset between the guarding electrode voltage and the sensing electrode voltage would not affect the usefulness of the guard, since for charge transfer through a capacitance only the voltage change is important.

It should be noted that although sensor 600 utilizes an impedance divider that uses two resistances 606 and 608, that this is merely one example of the type of impedance divider that can be used. Specifically, a typical impedance divider includes two passive impedances in series, with each passive impedance coupled to at least two nodes. One of those nodes is the common node to which both impedances couple. The common node provides the output of the impedance divider. The output of the impedance divider is a function of the voltages and/or currents applied at the "unshared nodes" over time. Simple examples of impedance dividers are voltage dividers that comprise two capacitances or two resistances (e.g., resistances 606 and 608). However, more complex impedance dividers can also be used. These more complex impedance dividers can include unmatched capacitances, resistances, or inductances in series or in parallel. Furthermore, individual impedances can have a combination of capacitive, resistive and inductive characteristics.

Guarding voltages may be applied using the features associated with signal pins 603 (FIG. 6A) or 310 (FIG. 6B) as appropriate. In the embodiment of FIG. 6A, for example, a voltage divider from the power supply ($V_{DD}$) is created using resistances 606 and 608, with pin 604 effectively switching resistance 608 in or out of the voltage divider circuit to create two separate voltages applied to guarding electrode 605. The embodiment shown in FIG. 6B similarly shows a divider circuit that includes a resistance 608 and a capacitor 614, with signal pin 310 controlling the guarding voltage applied to guarding electrode 605 to either the charging voltage or relaxing to a threshold voltage (acting much like how circuit 500 shown in FIG. 5A does when it shares charge). The impedance driving the guarding voltage should be less than the total sensor-coupled-impedance to the guarding electrode for the most effective guarding. A variety of other guarding techniques including active analog components such as buffers or operational amplifiers (OP-AMPS) that track a sensor or reference channel may also be used. Although FIGS. 6A-B are generally based upon the embodiments described in conjunction with FIG. 4A-D above, guarding concepts may be applied across a wide array of capacitance sensors. Nevertheless, guarding is an optional feature that may not be found on all embodiments.

Many alternate sensing schemes exploit sharing of discrete components and/or logic pins on controller 102 across multiple sensing channels. The sensor 650 shown in FIG. 6B, for example, shows a simple technique whereby delta capacitance 126 and integrating capacitance 108 are shared between two sensing electrodes 602 and 604. The sensor 700 shown in FIG. 7A similarly shows a simple technique by which a signal pin 308 for applying delta capacitance 126 can be shared between two sensing channels (represented by measurable capacitances 102A-B). In this embodiment, sensor 700 is operated in a manner similar to sensor 350 described above in conjunction with FIG. 3B, but with charge feedback to the sides of delta capacitances 126A-B provided through a common signal pin 308. In general, this embodiment changes phases to determine whether or not a particular integrating capacitance (e.g., 108A or 108B) is sensitive to a transition on the corresponding delta capacitance (126A and 126B). Specifically, each integrating capacitance can selectively share charge or block charge transfer from the measurable capacitance or the delta capacitance depending upon which side of the integrating capacitance is driven at a low impedance. Thus, each delta capacitance can be allowed to transition without affecting the measurable capacitance, and the signal pin 308 can be shared with multiple sensors reducing pin count. For a transcapacitive system a driven sensing electrode (e.g. 802 in FIG. 8A) can also be shared with multiple sensors. These concepts can be similarly applied to any number of additional sensing channels to further improve component and/or signal pin re-use between multiple measurable capacitances 102.

Figure 7A:
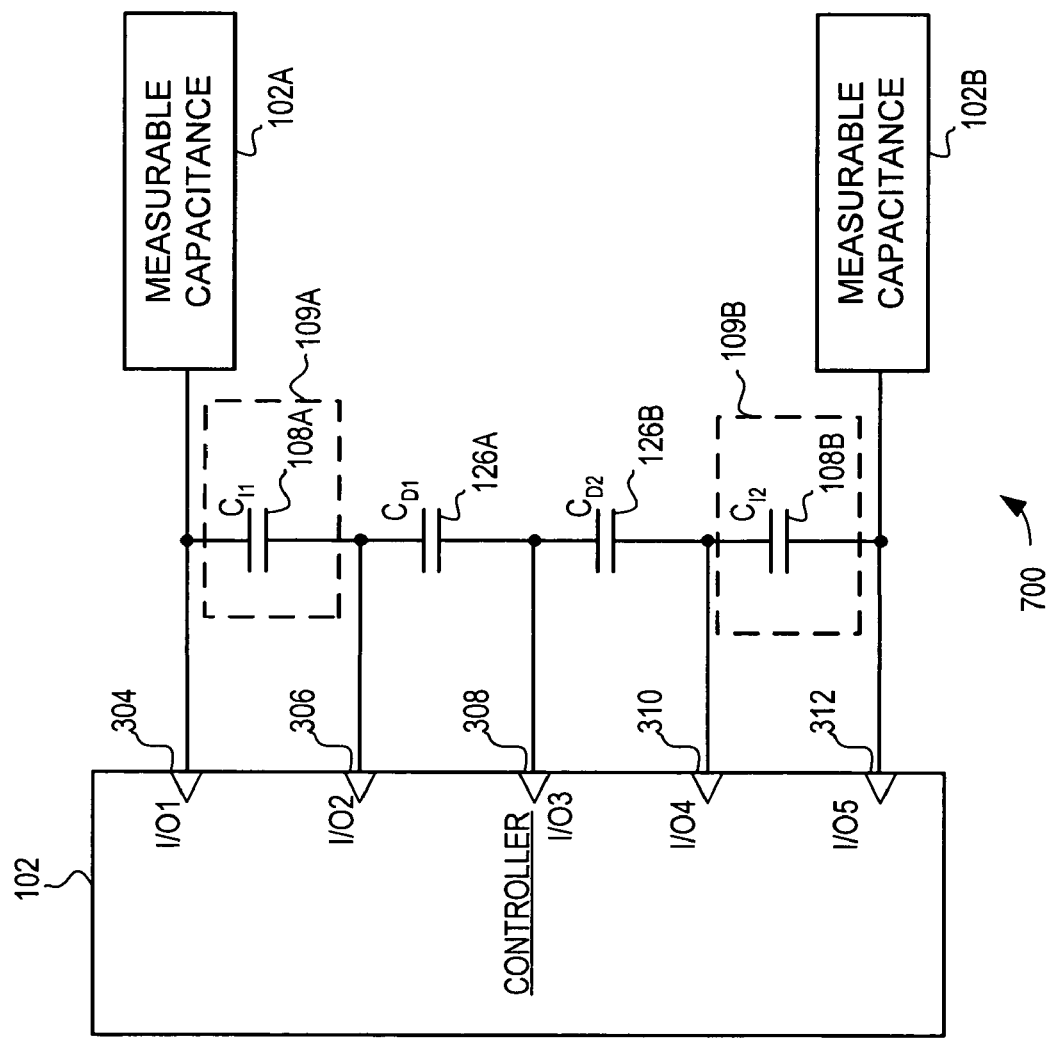

FIG. 7B includes a state diagram 750 that illustrates an exemplary state sequence for sensor 700. Referring to FIGS. 7A and 7B together, the first state 1 is to discharge the measurable capacitances by setting pins 304 and 312 to 0, while measuring (quantizing) the voltage at the integrating capacitances using I/Os associated with pins 306 and 310. In the example shown in the transitions in the state diagram for pins 304 and 306 indicates that the voltage at pin 306 measured (quantized data 1) high during state 1, whereas the transitions in the state diagram for pins 310 and 312 indicate that 310 measured (quantized data 0) low during state 1. These different state transitions cause different delta charge transfers in states 5-8 depending on their respective measurements. Note also that depending on the previous measurement and previous state of pins 304 and 312 in state 8, that a transition from high to low impedance may have occurred in state 1. Any voltage swing at pins 306 and 310 due to such a transition will cause some charge to share from parasitic capacitances as well as the delta capacitances 126A-B to their respective integrating capacitance 108A-B. This may cause an offset in the determination of the measurable capacitance, but so long as it is small and constant it may be subtracted out and the impact on dynamic range will be minimal.

The second state 2 comprises an intermediate high impedance state. In this state, the signal pins 304, 306, 310 and 312 are all briefly held in a high impedance state, with pin 308 driving the delta capacitances 126A-B low. This results in an intermediate state that decouples the various capacitors to temporarily trap charge in those capacitors. This assures that there are no overlapping signals that could otherwise inadvertently set an unwanted charge on a capacitor.

The third state 3 puts the electrode of integrating capacitances 108A and 108B coupled to the delta capacitances 126A-B at a logic high voltage. This causes the voltage on the measureable capacitances 102A-B to change and to share charge with their respective integrating capacitances 108A-B. At the same time by driving the signal pins 306 and 310 to a low impedance charge transfer coupled through the delta capacitances 126A-B is blocked.

The fourth state 4 clears the charge on delta capacitances 126A and 126B since both sides of these capacitors are set to the same logic high voltage by pins 306, 308, and 310.

The fifth stage 5 puts pin 306 at a high impedance state, which holds the charge on integrating capacitance 108A. This is an intermediate high impedance state on signal pin 304 for measurable capacitance 102A before it transitions in the following state 6 and prevents charge from inadvertently being set on the integrating capacitance 108A. Note that only the I/O coupled to the integrating capacitance 108A, which had a voltage at pin 306 with a quantized data measurement of 1, was decoupled. The pin 310 coupled to integrating capacitance 108B which had a voltage at pin 310 with a quantized data measurement of 0 remains driven to a logic high voltage, because that integrating capacitance did not require charge modification by delta capacitance 126B.

The sixth state 6 drives the signal pin 304 to a low logic level so that a delta charge can be transferred through delta capacitance 126A to integrating capacitance 108A in the subsequent step 7. Note that pin 310 remains driven to a logic high level blocking this delta capacitance charge transfer between 126B and 108B. Note also that this low logic level transition on pin 304 also causes the charge to share from parasitic capacitances and delta capacitances in this step rather than in future step 1 as already described.

The seventh state 7 transitions the voltage on pin 308 to remove charge through the delta capacitance 126A from the integrating capacitance 108A, while the charge on integrating capacitance 108B is not substantially affected.

The final state 8 comprises a second intermediate high impedance state for integrating capacitances (e.g. 108B) that did not require charge modification in step 7, and to prepare them for sharing in the following steps. This again decouples the various capacitors to temporarily trap charge in those capacitors.

With the final state 8 completed, the method returns to step 1 and the states 1-8 are executed again. It should be noted that this sequence produces results from the measurements at pins 306 and 310 of a voltage on the integrating capacitances 108A-B and quantized data (e.g. 0 or 1) suitable for a determination of their respective measurable capacitances 102A-B. The sequence of steps for measurable capacitance 102A and pins 304 and 306, as well as, measurable capacitance 102B and pins 310 and 312 are exemplary only of a particular measurement (and quantization) of the voltage on pins 306 and 310 in the exemplary step 1, and either sequence of states could be present on either measurable capacitance and integrating capacitance depending on that measurement in a repetition of the measurement cycle. Typically, in a measurement of a measurable capacitance both sequences of states will occur on the related pins, and resulting quantized data (e.g. 0 and 1) of both types will be part of any result used to determine the measurable capacitance.

It should be noted that this embodiment facilitates several advantages. For example, because the common node (i.e., pin 308) is always driven, the effect of parasitic capacitance may be significantly reduced. Second, sensor 700 may reduce the number of cycles that it takes to apply the IO states and sample multiple capacitances since it allows sampling (i.e. quantizing at multiple I/Os simultaneous) in parallel. Finally, it will allow significantly fewer IOs when many measurable capacitances are detected. This embodiment can also reduce the sensitivity to external noise coupled by the measurable capacitances or other associated parasitic capacitances coupled to pins 304 and 312 by grounding the nodes coupled to the measurable capacitances (i.e. pins 304 and 312) during integrating capacitance charge measurements.

Figure 8A:
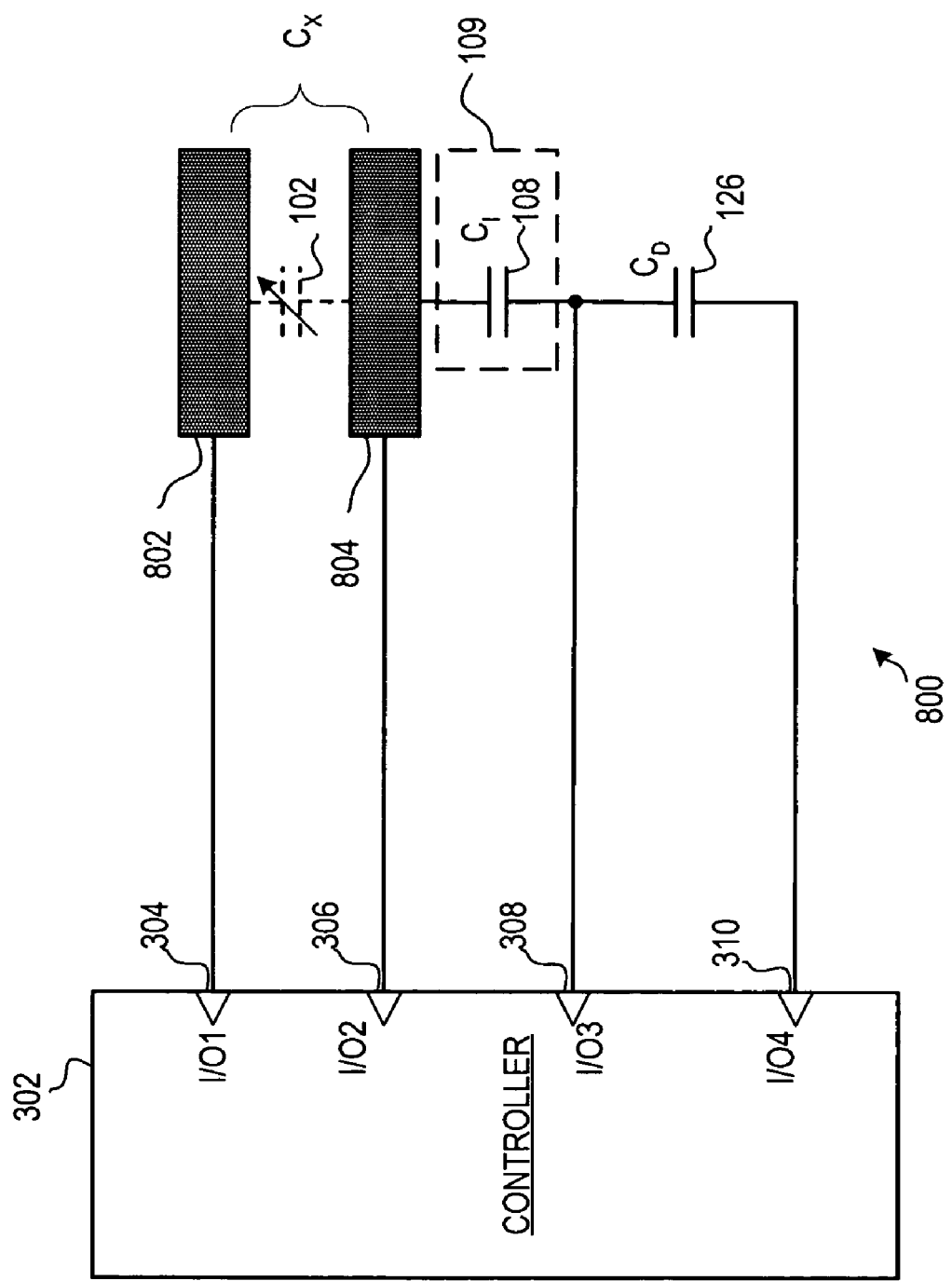
FIG. 8A is a diagram of an exemplary series transcapacitive sensor implemented with sigma-delta techniques.

Although the embodiments shown above generally emphasize so-called "absolute capacitance" sensors in which the measurable capacitance is measured with respect to local system ground, similar concepts may be applied to other types of capacitance sensors. FIG. 8A, for example, shows another embodiment of a sensor 800 that is designed to work with so-called "driven capacitance" or "transcapacitive" sensors. The sensor 800 is a "series" sensor as the integrating capacitance 108 is in series with the delta capacitance 126 and the measurable capacitance 102. In the embodiment shown in FIG. 8A, the measurable capacitance 102 is formed by two separate electrodes 802, 804, each of which may be driven to a voltage using signal pins 304, 306 of controller 302. As a waveform is driven on "driving" electrode 802, capacitive coupling between electrodes 802 and 804 can be detected using the sigma-delta sensing techniques described above to sense the charge transferred between the electrodes 802, 804 and to the passive network 109 comprising integrating capacitance 108. As a result, sensors that rely upon changes in capacitive coupling between a "driving" and "sensing" electrode may readily implement the concepts described above without significant modification. Note as previously described the transcapacitive measurable capacitances may be affected by any number of other conductors and/or dielectrics, to create complex total effective capacitances with elements in proximity to the electrodes 802 and 804. Furthermore, phase shifting of the sharing step during a repetition of the charging cycle similar to that described for the delta capacitance and shown in state diagram 750, may also be practiced to block or allow charge sharing with the "driving" electrode in transcapacitive sensors.

FIG. 8B includes a stale diagram 825 that illustrates an exemplary state sequence for sensor 800. Referring to FIGS. 8A and 8B together, in the first state 1 a delta charge may be added to the integrating capacitance 108 through delta capacitance 126 (Cd) by changing the state of I/O4 on signal pin 310. This change of logic state on 310 from low to high logic levels (or just staying low) in state 1 depends as a function $F(V_{CI})$ on a previous quantization of the voltage on integrating capacitance 108 at pin 308 in a previous state 7. As one example, the function $F(V_{CI})$ may be selected such that if the voltage at the integrating capacitance 108 was higher than the threshold voltage $V_{TH}$ for I/O3 of signal pin 308 in the previous cycle (i.e., the charge on the integrating capacitance is low, and the voltage drop smaller than desired), then pin 310 remains low, If instead, the voltage at the integrating capacitance 108 was lower than the threshold voltage (i.e., the charge on the integrating capacitance is high, and the voltage drop larger than desired), then pin 310 is driven high to raise the voltage at 308 by removing charge from integrating capacitance 108 through delta capacitance 126. In each repetition of the charge transfer process, charge is also transferred through measurable capacitance Cx 102 between electrodes 802 and 804 as I/O1 transitions from low to high adding charge to the integrating capacitance. By adding charge through the measurable capacitance 102 and removing charge through the delta capacitance 126 under the control of the sigma-delta system the charge on the integrating capacitance 108 is kept roughly constant by negative feedback control.

Thus, state 1 either does or does not remove charge from integrating capacitance 108 using delta capacitance 126 based on the previous voltage measurement at I/O3 of the integrating capacitance on pin 308. This measurement might be done in a variety of ways in alternate embodiments, for example the measurement of voltage on the integrating capacitance might use pin 306.

State 2 is an intermediate high impedance state on both sides of integrating capacitance 108 (ie. signal pins 306 and 308). This traps the integrated charge on integrating capacitance 108 so that any timing errors on the outputs of the signal pins do not inadvertently change the charge on it. Pin 304 remains driven low, and pin 310 is left in its previous state.

In state 3 the signal pin 308 is set to a low logic state (e.g. ground). Note that the voltage on pin 308 was measured in the previous state 7, and should have been close to a threshold of an input associated with signal pin 308 and I/O3. By driving 308 to a logic low state and changing the voltage on one side of integrating capacitance 108 the voltage at sensing electrode 804 also changes and the integrating capacitance 108 shares charge with the measurable capacitance 102, as well as with any other parasitic capacitance coupled to the node at signal pin 306 and sensor 804. In this exemplary case the charge shared with the measurable capacitance 102 is in the same direction as the charge transferred by driving I/O1 on pin 304 high in the following step, though this need not be the case in all implementations. The charge shared onto the integrating capacitance 108 from the parasitic capacitance due to any voltage change on 804 occurs just as in other "absolute capacitance" sensors described elsewhere in this document, though this example is meant to function as a transcapacitive sensor. This parasitic charge is shared onto integrating capacitance 108, and in this example will tend to add charge to it, reducing the measured voltage on integrating capacitance 108 at pin 308.

In the fourth state 4, charge is shared from the electrode 804 to the integrating capacitance 108 as I/O1 on pin 304 changes from a logic low to logic high voltage, and any charge on delta capacitance 126 is cleared. Specifically, in this state pin 304 is driven high while pin 310 goes low. This allows charge to share from electrode 804 to the integrating capacitance 108 through the measurable capacitance 102 (Cx). At the same time the voltages on both sides of delta capacitance 126 at signal pin 310 and 308 are driven low. Since the node at pin 308 is at a low impedance no charge is transferred through delta capacitance 126 onto the integrating capacitance 108 in this step.

The fifth state 5 is another high impedance state decoupling both sides of the integrating capacitance 108.

The sixth state 6 drives the sensing electrode 804 of measurable capacitance ($C_X$) 102 to a logic high voltage to block charge sharing coupled through the sensing electrode 804, and allow sharing with delta capacitance 126. Driving a low impedance on the signal pin 306 of I/O2 shields the integrating capacitance 108 from any noise coupled to that electrode during the following measurement step. It also allows charge to share through the integrating capacitance 108 with the node connected to signal pin 308 and delta capacitance 126. However, by driving a logic high voltage on electrode 804, the voltage at the 308 signal pin node is also changed. This again causes charge to be shared through any parasitic capacitance on pin 308 with the integrating capacitance 108. Charge is also shared with delta capacitance 126 since signal pin 310 is driven with a low impedance in this example, though that need not be the case in other embodiments. Note that unlike the sharing of measurable capacitance in state 3 this parasitic charge will be in the opposite direction of the charge transferred through the delta capacitance 126 when signal pin 310 is driven to a different voltage in state 1 to change charge on the integrating capacitance. Some charge proportional to the voltage change and the size of the parasitic and delta capacitances will share and tend to increase the voltage on integrating capacitance 108 and reducing the voltage measured on it at pin 308. This could be reduced significantly (to only parasitic capacitances), if pin 310 was put in a high impedance state. So long as the voltage transition on 308 due to driving 306 high is less than the voltage transition on 310 used to subtract charge in step 4, then net charge can still be subtracted by delta capacitance 126 in the transcapacitive sigma-delta process.

The seventh state 7 measures the voltage on the integrating capacitance 108. With the pin 308 at a high impedance state, the voltage (due to the integrated charge) on the integrating capacitance 108 can be measured at pin 308 relative to the voltage driven on the sensing electrode by signal pin 306. This measurement can comprise a comparison of the voltage at the integrating capacitance 108 with a threshold voltage $V_{TH}$ to provide a quantized result. The resulting measurement of the voltage on integrating capacitance 108 (i.e. whether it is higher than threshold voltage $V_{TH}$) will then be used in $F(V_{CI})$ in the next repetition of the cycle during states 1-3 determining how the charge on integrating capacitance might be changed by delta capacitance 126.

Thus, the repeated execution of states 1-7 will result in sigma-delta closed loop control of charge on the integrating capacitance 108, and a filtered measurement of the quantized results can be used to measure the transcapacitance between electrodes 802 and 804. This measured transcapacitance can further be used to sense the proximity of an object relative to the sensor or for any other purpose.

Note that the voltage changes at the shared node of integrating capacitance 108 opposite the driven node in steps 3 and 6 cause unwanted charge transfer due to parasitic capacitances, and can cause charge sharing through measurable capacitance 102 or delta capacitance 126 opposing the intended direction. This represents the "absolute capacitance" action of the transcapacitive sensor. The smaller these voltage changes are relative to the voltage swings used by signal pin 304 driving electrode 802, and signal pin 310 driving the delta capacitance 126, the less effect parasitic capacitances will have and the more ideal the function of the transcapacitive sigma-delta measurement system will be.

Figure 8C:
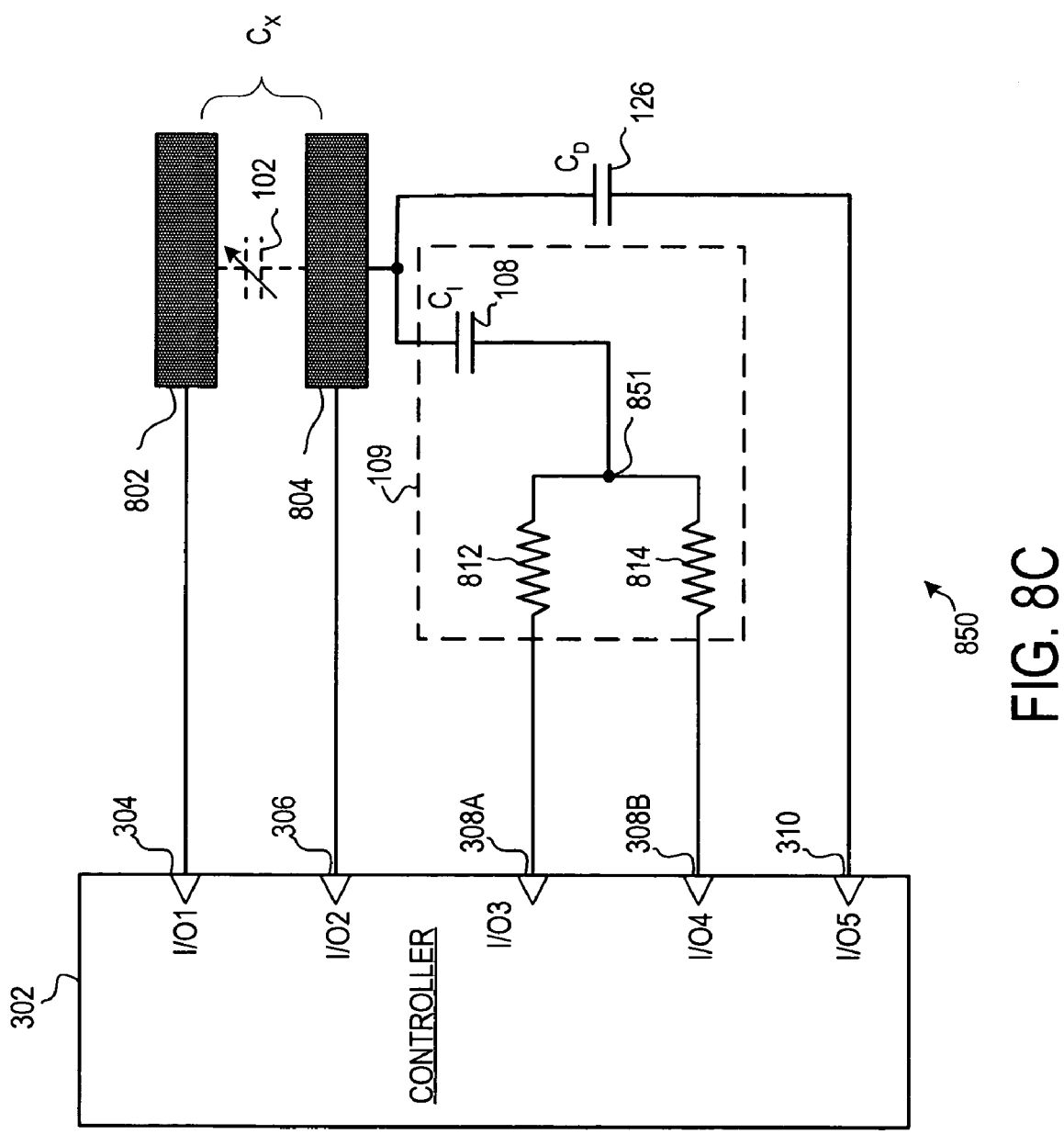
FIG. 8C is a diagram of an exemplary parallel transcapacitive sensor implemented with sigma-delta techniques.

Turning now to FIGS. 8C and 8D, a second embodiment of a transcapacitive sensor 850 is illustrated. The transcapacitive sensor 850 is a parallel sensor, in that the measurable capacitance 102 is in parallel with the delta capacitance 126 in its connection to integrating capacitance 108. Also, in this embodiment a voltage $V_G$ close to threshold voltage $V_{TH}$ is generated with a voltage divider comprising resistances 812 and 814. As with the previous embodiment, the measurable capacitance 102 is formed by two separate electrodes 802, and 804, each of which may be driven to a voltage using signal pins 304, 306 of controller 302. As a waveform is driven on electrode 802, capacitive coupling (indicated by the measurable capacitance 102) between electrodes 802 and 804 can be detected using sigma-delta sensing techniques to sense the charge transferred between the electrodes 802, 804 and to the passive network 109 comprising integrating capacitance 108.

FIG. 8D includes a state diagram 875 that illustrates an exemplary state sequence for sensor 850. Referring to FIGS. 8C and 8D together, the first state 1 comprises an intermediate high impedance state. In this state, the signal pins 306, 308A and 308B are all held in a high impedance state, with pin 304 driven to a logic low voltage, and pin 310 driven to a logic high voltage. This results in an intermediate state that decouples the various capacitors to temporarily trap charge in those capacitors. This assures that there is no overlapping signals that could otherwise inadvertently set an unwanted charge on a capacitor.

In the second state 2, the voltage on the integrating capacitance 108 at node 851 is set to a generated voltage $V_G$ implemented to substantially equal the threshold voltage $V_{TH}$ of the measuring I/O (e.g. IO3). Specifically, pin 308A provides a logic high voltage (e.g. $V_{DD}$), pin 308B provides a logic low voltage (e.g. GND), and resistances 812 and 814 provide a voltage divider that generates a voltage $V_G$ at node 851. In one example embodiment, the resistances 812 and 814 are substantially equal, and the generated voltage is thus approximately /1;2 $V_{DD}$, comparable to a CMOS input threshold. There are many methods for applying the generated voltage using passive components and switches (e.g. I/Os or DACs) and this is only one example. The threshold voltage of a digital input is the voltage that distinguishes a low from a high input. Of course, this is just one example, and in other embodiments it may be desirable to use other values. For example, in the case where the I/O's utilize a Schmidt trigger input a voltage of Vdd/3 might approximate the input threshold of the I/O3 which was just set to a logic high. It should also be noted that in some embodiments the voltage divider will not be used. Instead, in some embodiments the controller 302 inherently includes the ability to generate an appropriate voltage $V_G$ near $V_{TH}$.

It should also be noted that driving node 851 with a generated voltage Vg near the threshold voltage $V_{TH}$ reduces the voltage swing on electrode 804 in steps 2-3, because the sigma-delta feedback loop controls the charge on the integrating capacitance 108 to keep the voltage on the node 851 near the threshold voltage when signal pin 306 drives node 804 (in steps 5,6,7) and an input connected to node 851 (e.g. 308A) can be measured. Keeping the voltages at 804 and 851 constant makes parasitic capacitance to fixed voltages (e.g. GND) largely irrelevant since charge moving through the parasitic capacitance is minimized. Note that if measurements of the voltage on integrating capacitance 108 were done with I/O2 on pin 306 then the node 306 might be driven with a similar generated voltage Vg to minimize the effect of parasitic capacitance.

In the third state 3, a delta charge is transferred to the integrating capaitance 108 and/or charge is shared between the electrode 804 and the integrating capacitance 108, depending on previous measurements of the voltage on the integrating capacitance 108 at 308A. Specifically, the pin 310 is driven as a function $F(V_{CI})$ of the previously measured voltage on the integrating capacitance 108 at 308A. As one example, the function $F(V_{CI})$ is selected such that if the voltage at the integrating capacitance 108 (e.g., at node 851) was higher that the threshold voltage $V_{TH}$ for I/O3 in the previous repetition of the measurement cycle (i.e., the charge on the integrating capacitance is low, and the voltage drop smaller than desired), then pin 310 is remains at a logic high voltage. If instead, the voltage at the integrating capacitance 108 was lower than the threshold voltage (i.e., the charge on the integrating capacitance is high, and the voltage drop smaller than desired), then pin 310 is driven to a logic low voltage to remove charge from imtegrating capacitance 108 through delta capacitance 126. In all cases charge is also transferred through measurable capacitance Cx 102 between electrodes 802 and 804 as I/O1 transitions from a logic low voltage to a logic high voltage adding charge to the integrating capacitance. By adding charge through the measurable capacitance and removing charge through the delta capacitance under the control of the sigma-delta system the charge on the integrating capacitance is kapt roughly constant by negative feedback control.

Thus, state 3 either shares charge between electrode 804 and integrating capacitance 108 or removes charge from integrating capacitance 108 using delta capacitance 126 based on the previous voltage measurement at I/O3 on pin 308A of the integrating capacitance.

The fourth state 4 comprises another intermediate high impedance state that assures that there are no overlapping signals that could otherwise indvertently set an unwanted charge on a capacitor. The fifth state 5 sets the receiving electrode 804 to a logic high voltage again through I/O2 on signal pin 306. The sixth state 6 set the charge on the measurable capacitance ($C_X$) 102 and the delta capacitance ($C_D$) 126 in preparation for transitions on a following repatition of the charge tarnafer process. Spacifically, a logic high voltage is put on pin 310 while a logic high voltage is also put on 306 discharging delta capacitance 126. At the same time a logic low voltage is placed on electrode 802 through signal pin 304 recharging the measurable capacitance coupled to electrode 804. By putting a low impedance voltage on the 804 electrode of measurable capacitance 102, and on the side of integrating capacitance 108 couple to the delta capacitance 126, charge will not be transferred onto the integrating capacitance 108 during this step through either delta capacitance 126 or measurable capacitance 102. This assures that the value of the integrating capacitance 108 remains an accurate representation of the transferred charge during previous steps, and that it can be measured without being disturbed by noise from sensing electrode 804.

The seventh state 7 measures the voltage at the integrating capacitance 108. With the pins 308 at a high impedance state, the voltage (due to the integrated charge) on the integrating capacitance 108 (e.g., the voltage at node 851) can be measured at pin 308A or pin 308B. This measurement can comprise a comparison of the voltage at the integrating capacitance 108 with the threshold voltage $V_{TH}$ to provide a quantized result. The resulting measurement of the voltage on integrating capacitance 108 (i.e. whether it is higher than threshold voltage $V_{TH}$) will then be used in $F(V_{CI})$ in the next cycle during states 3-5 determining how the charge on integrating capacitance might be changed by the delta capacitance 126.

Thus, the repeated execution of states 1-7 will result in sigma-delta closed loop control of charge on the integrating capacitance 108, and a filtered measurement of the quantized results can be used to measure the transcapacitance between electrodes 802 and 804. This measured transcapacitance can further be used to sense the proximity of an object relative to the sensor As described above, the sensor embodiments illustrated in FIG. 8 measure transcapacitance rather than absolute or ground referenced capacitance. These embodiments reduce the negative effects of background or parasitic capacitance on the measured capacitance and thus are particularly usefully in applications where there is a higher proportion of parasitic trace capacitance, such as fingerprint ridge sensing and capacitive touch sensing.

For example, when driving a generated voltage Vg on node 851 roughly equivalent to an input threshold voltage of a signal pin coupled to 851 (e.g. 308A/B where they are I/Os), the amount of voltage swing on the sensed electrode 804 can be held to a relatively low level by sigma-delta feedback control. This can substantially reduce sensitivity to parasitic capacitance. That is, since the voltage on integrating capacitance 108 at node 851 remains relatively close to the threshold voltage during steady-state operation, both when the voltage is driven on node 851 (and 306 is floating), and when voltage is driven on 306, and node 851 is not driven by signal pins 308A/B. Similarly, the voltage swing on electrode 804 is kept relatively low since signal pin 306 is driven to a voltage similar to what results when the voltage at node 851 is driven to a voltage at one of 308A/B's input thresholds (instead of driving signal pin 306 to some other voltage). The voltage difference between 851 and 306 is determined by the voltage across (and charge on) the integrating capacitance, which is controlled by the sigma-delta negative feedback loop. These voltages on 306 and node 851 can be applied in any manner. In various embodiments, the approximate threshold voltage is applied using logic from pin(s) 308A-B to activate or deactivate a portion of a voltage divider network that results in the appropriate voltage. Alternatively, the approximate voltage may be applied by digital-to-analog converter, or by any other technique Even more enhancements and modifications can be performed to the various circuits and techniques shown herein. Higher order sigma-delta modulators can be implemented using the techniques described above, with or without additional active analog components.

In addition, various sources of noise, for example, can be reduced through the use of noise dither techniques. In particular, conventional first-order sigma-delta converters are known to be especially susceptible to noise "tones" (i.e.

repeating patterns of noise). These tones can produce a noisy output for certain constant inputs (such that "dead zones" where capacitance sensitivity is low (or alternately, error is high) exist), resulting in reduced response to slight changes in input conditions. Tones can be avoided through the use of more sophisticated (i.e. higher order) sigma-delta techniques, or alternatively by injecting a small amount of low power noise into the sigma-delta converter. One technique for injecting noise involves applying a noise dither to the ADC reference voltage (e.g. voltage 112 in FIG. 1). This dither may be generated in any sort of software or other logic, and can be applied simultaneously to each of the sensing channels to improve response.

Figure 10:
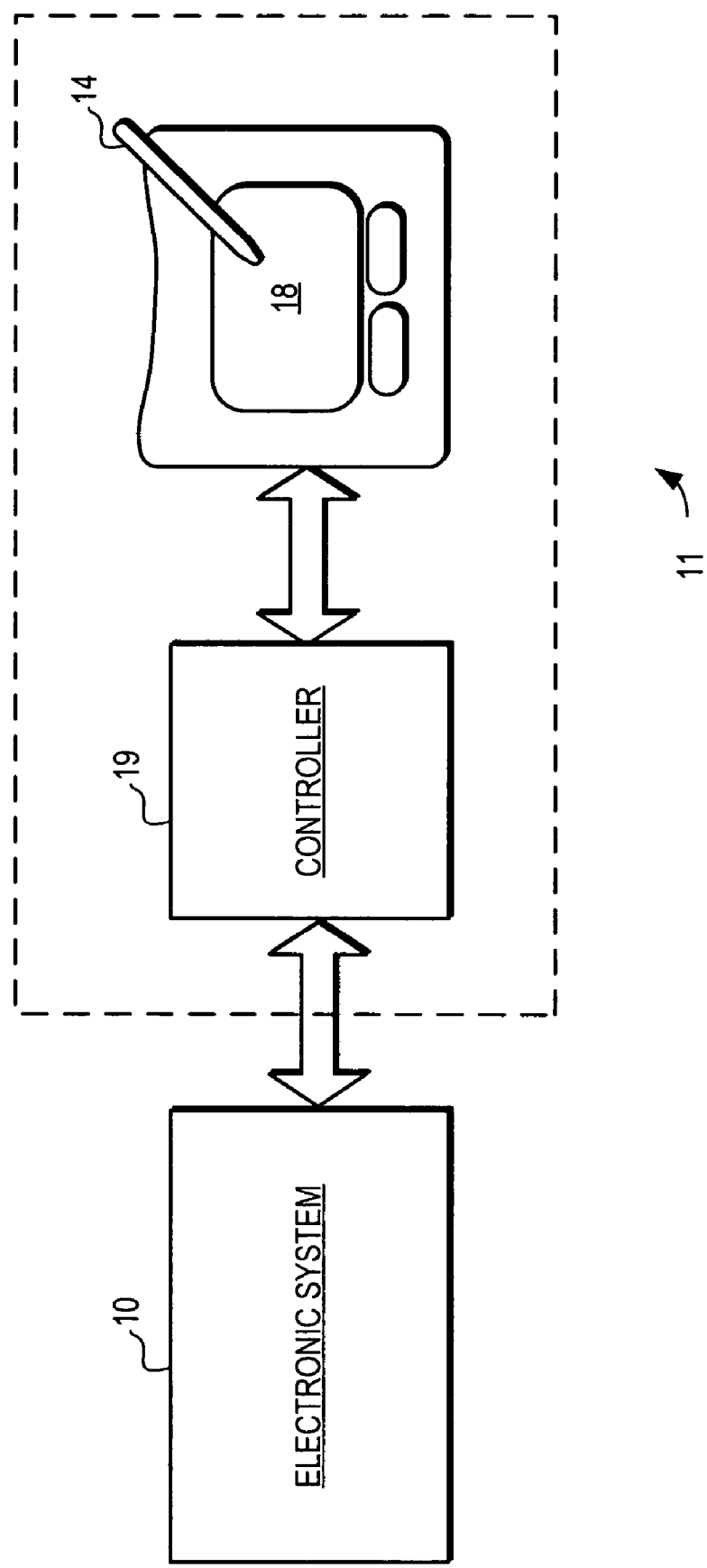
FIG. 10 is a schematic diagram of a proximity sensor device with an electronic system.

As stated above, the devices and methods for determining capacitance are particularly applicable for use in proximity sensor devices. Turning now to FIG. 10, a block diagram is illustrated of an exemplary electronic system 10 that is coupled to a proximity sensor device 11. Electronic system 10 is meant to represent any type of personal computer, portable computer, workstation, personal digital assistant, video game player, communication device (including wireless phones and messaging devices), media device, including recorders and players (including televisions, cable boxes, music players, and video players) or other device capable of accepting input from a user and of processing information. Accordingly, the various embodiments of system 10 may include any type of processor, memory or display. Additionally, the elements of system 10 may communicate via a bus, network or other wired or wireless interconnection. The proximity sensor device 11 can be connected to the system 10 through any type of interface or connection, including I2C, SPI, PS/2, Universal Serial Bus (USB), Bluetooth, RF, IRDA, or any other type of wired or wireless connection to list several non-limiting examples.

Proximity sensor device 11 includes a controller 19 and a sensing region 18. Proximity sensor device 11 is sensitive to the position of an input 14 (which can be provided by one or more fingers, styli, and/or other input objects) in the sensing region 18, and can detect the input 14 by measuring the resulting changes in capacitance due to input 14. "Sensing region" 18 as used herein is intended to broadly encompass any space above, around, in and/or near the proximity sensor device 11 wherein the sensor is able to detect a position of the object. In a conventional embodiment, sensing region 18 extends from a surface of the sensor in one or more directions for a distance into space until signal-to-noise ratios prevent input detection. This distance may be on the order of less than a millimeter, millimeters, centimeters, or more, and may vary significantly with the sensor electrode dimensions, sensor design, and/or the sensor performance (e.g. accuracy or resolution) desired. Accordingly, the planarity and curvature, size, shape and exact locations of the particular sensing regions 18 will vary widely from embodiment to embodiment.

In operation, proximity sensor device 11 suitably detects a position of input 14 by measuring the measurable capacitance(s) associated with the plurality of sensing electrodes which are affected by one or more fingers, styli, and/or other objects within sensing region 18. And, using controller 19, proximity sensor device 11 provides electrical or electronic indicia of the position to the electronic system 10. The system 10 appropriately processes the indicia to accept inputs from the user for any appropriate purpose and produces any appropriate responses, as discussed earlier.

The proximity sensor device 11 can use discrete arrays, or any other arrangement of capacitive sensor electrodes to support any number of sensing regions 18. The proximity sensor device can also vary in the type of information provided, such as to provide "one-dimensional" position information (e.g. along a sensing region) as a scalar, "two-dimensional" position information (e.g. horizontal/vertical axes, angular/radial, or any other axes that span the two dimensions) as a combination of values, a "two-dimensional" image of the proximity as an array of values, and the like.

The controller 19, sometimes referred to as a proximity sensor processor or touch sensor controller, generally directs the process used to measure capacitance using any of the various techniques described above. Here, controller 19 also communicates with the electronic system 10. The controller 19 can perform a variety of additional processes to implement the proximity sensor device 11. For example, the controller 19 can select or connect individual measurable capacitances, calculate position or motion information based on the values of the measurable capacitances, report a position or motion when a threshold is reached, interpret and wait for a valid tap/stroke/character/button/gesture sequence before reporting it to the electronic system 10 or indicating it to the user, or any of a multitude of different processes.

In this specification, the term "controller" is defined to include one or more processing elements that are adapted to perform the recited operations. Thus, the controller 19 can comprise all or part of one or more integrated circuits, firmware code, and/or software code.

Again, as the term is used in this application, the term "electronic system" broadly refers to any type of device that communicates with proximity sensor device 11. The electronic system 10 could thus comprise any type of device or devices in which a touch sensor device can be implemented in or coupled to. The proximity sensor device 11 could be implemented as part of the electronic system 10, or coupled to the electronic system 10 using any suitable technique. As non-limiting examples the electronic system 10 could thus comprise any type of computing device, media player, communication device, or another input device (such as another touch sensor device or keypad). In some cases the electronic system 10 is itself a peripheral to a larger system. For example, the electronic system 10 could be a data input or output device, such as a remote control or display device, that communicates with a computer or media system (e.g., remote control for television) using a suitable wired or wireless technique. It should also be noted that the various elements (processor, memory, etc.) of the electronic system 10 could be implemented as part of an overall system, as part of the touch sensor device, or as a combination thereof. Additionally, the electronic system 10 could be a host or a slave to the proximity sensor device 11.

It should also be noted that the term "proximity sensor device" is intended to encompass not only conventional proximity sensor devices, but also a broad range of equivalent devices that are capable of detecting the position of a one or more fingers, pointers, styli and/or other objects. Such devices may include, without limitation, touch screens, touch pads, touch tablets, biometric authentication devices, handwriting or character recognition devices, and the like. Similarly, the terms "position" or "object position" as used herein are intended to broadly encompass absolute and relative positional information, and also other types of spatial-domain information such as velocity, acceleration, and the like, including measurement of motion in one or more directions. Various forms of positional information may also include time history components, as in the case of gesture recognition and the like. Accordingly, proximity sensor devices can appropriately detect more than the mere presence or absence of an object and may encompass a broad range of equivalents.

It should also be understood that the mechanisms of the present invention are capable of being distributed as a program product in a variety of forms. For example, the mechanisms of the present invention can be implemented and distributed as a proximity sensor program on a computer-readable signal bearing media. Additionally, the embodiments of the present invention apply equally regardless of the particular type of signal bearing media used to carry out the distribution. Examples of signal bearing media include: recordable media such as memory cards, optical and magnetic disks, hard drives, and transmission media such as digital and analog communication links.

Various other modifications and enhancements may be performed on the structures and techniques set forth herein without departing from their basic teachings. Accordingly, there are provided numerous systems, devices and processes for detecting and/or quantifying a measurable capacitance. While at least one exemplary embodiment has been presented in the foregoing detailed description, it should be appreciated that a vast number of variations exist. The various steps of the techniques described herein, for example, may be practiced in any temporal order, and are not limited to the order presented and/or claimed herein. It should also be appreciated that the exemplary embodiments described herein are only examples, and are not intended to limit the scope, applicability, or configuration of the invention in any way. Various changes can therefore be made in the function and arrangement of elements without departing from the scope of the invention as set forth in the appended claims and the legal equivalents thereof.

What is claimed is:

1. A method for measuring a measurable capacitance, the method comprising the steps of:
    applying a voltage to the measurable capacitance using a first switch;
    allowing the measurable capacitance to share charge with a passive network;
    changing a charge on the passive network by a quantized amount of charge if the charge on the passive network is past a threshold of a quantizer, the quantized amount of charge determined at least in part as a function of a quantized value outputted by the quantizer; and
    repeating each of the applying step, the allowing step, and the changing step at least once.

2. The method of claim 1 wherein the step of applying a voltage comprises applying a pre-determined voltage and wherein the quantized amount of charge is based on the pre-determined voltage.

3. The method of claim 1 further comprising the step of determining a value for the measurable capacitance based at least in part upon a number of repetitions of the changing step.

4. The method of claim 1 wherein a number of repetitions of the applying step is not equal to a number of repetitions of the changing step.

5. The method of claim 1 wherein the changing step comprises altering the charge on the passive network multiple times.

6. The method of claim 1 wherein the applying step is performed multiple times for each repetition of the changing step, and the allowing step is performed multiple times for each repetition of the changing step.

7. The method of claim 1 wherein the applying step comprises actuating an output pin of a digital control circuit.

8. The method of claim 1 wherein the quantized amount of charge changed on the passive network corresponds to a charge on a feedback capacitance.

9. The method of claim 1 wherein the quantized amount of charge changed on the passive network corresponds to a current applied through a resistance for a known period of time.

10. The method of claim 9 wherein the current is applied by applying a second voltage across the resistance.

11. The method of claim 1 further comprising the step of multiplexing the applying, allowing and changing steps between a plurality of measurable capacitances, wherein the measurable capacitance is one of the plurality of measurable capacitances.

12. The method of claim 1 wherein the applying and allowing steps are performed using only switches and passive elements.

13. The method of claim 12 wherein the switches comprise digital outputs of a controller.

14. The method of claim 1 wherein the applying, allowing and changing steps are performed using digital inputs and outputs of a controller.

15. The method of claim 1 wherein the threshold is determined by a threshold voltage of a digital input of a controller.

16. The method of claim 1 wherein the threshold is determined by an analog-to-digital converter.

17. The method of claim 1 wherein the applying step comprises charging the measurable capacitance and the changing step comprises removing charge from the passive network.

18. The method of claim 1 wherein the applying step comprises discharging the measurable capacitance and the changing step comprises adding charge to the passive network.

19. The method of claim 1 wherein the allowing step comprises passively permitting the measurable capacitance to share charge with the passive network using a sharing circuit, and the applying step occurs substantially faster than a time constant of the sharing circuit.

20. The method of claim 1 wherein the allowing step comprises controlling a second switch.

21. The method of claim 1 wherein the quantized amount of charge is determined as a function of the quantized value by applying a digital filter to the quantized value.

22. The method of claim 1 further comprising the step of applying a guarding voltage to a guarding electrode distinct from the measurable capacitance.

23. The method of claim 22 wherein the guarding voltage applied to the guarding electrode during the applying step is substantially equal to the voltage applied to the measurable capacitance during the applying step.

24. The method of claim 22 wherein the guarding voltage applied to the guarding electrode is substantially equal to a voltage on the measurable capacitance after the allowing step.

25. The method of claim 22 wherein a change in the guarding voltage applied to the guarding electrode between the applying and allowing steps approximates a change in voltage on the measurable capacitance between the applying and allowing steps.

26. A digital storage medium having computer-executable instructions stored thereon configured to execute the method of claim 1.

27. A method for measuring a capacitance value, the method comprising the steps of:

applying a voltage to a first capacitance using a first switch;

allowing the first capacitance to share charge with a passive network;

measuring a network voltage on the passive network using a threshold voltage of a quantizer;

changing a charge on the passive network by a quantized amount of charge using a charge transfer circuit responsive to the network voltage on the passive network being past the threshold voltage of the quantizer, the quantized amount of charge determined at least in part as a function of a quantized value outputted by the quantizer; and repeating each of the applying step, the allowing step, the measuring step, and the changing step at least once.

28. The method of claim 27 wherein the capacitance value comprises a measure of a variable capacitance measured between a sensor electrode and an object proximate the sensor electrode.

29. The method of claim 27 wherein the capacitance value comprises a measure of a variable transcapacitance measured between sensor electrodes.

30. The method of claim 29 wherein the first capacitance comprises the variable transcapacitance, and wherein the applying step comprises applying the voltage across the variable transcapacitance by applying a second voltage to a first one of the sensor electrodes.

31. The method of claim 30 wherein the first one of the sensor electrodes is coupled to the passive network, and wherein the allowing step comprises disconnecting the second voltage from the first one of the sensor electrodes, and changing a voltage level on a second one of the sensor electrodes.

32. The method of claim 31 wherein the step of changing the voltage level comprises:

applying a third voltage to the second one of the sensor electrodes; and applying a fourth voltage different from the third voltage to the second one of the sensor electrodes, wherein one of the third voltage and fourth voltage is substantially equal to a reference voltage.

33. The method of claim 31 wherein the step of changing the voltage on a second sensor applying a third voltage to the second one of the sensor electrodes; and applying a fourth voltage different from the third voltage to the second one of the sensor electrodes, wherein one of the third voltage and fourth voltage is substantially equal to the second voltage.

34. A method for measuring a plurality of measurable capacitances in a proximity sensor device, the method comprising the steps of:

selecting a measurable capacitance in the plurality of measurable capacitances, and for the selected measurable capacitance:

applying a predetermined voltage to the selected measurable capacitance using a corresponding digital output;

allowing the selected measurable capacitance to share charge with a passive network, the passive network comprising at least one integrating capacitor;

comparing a voltage on the passive network to a threshold voltage and generating a quantized value responsive to the measuring;

changing a charge on the passive network by a quantized amount of charge based on the quantized value;

repeating each of the applying step, the allowing step, the comparing step, and the changing step at least once for the selected measurable capacitance; and determining a value of the selected measurable capacitance by digitally filtering quantized values generated responsive to repetitions of the comparing step; and performing each of the applying step, the allowing step, the comparing step, the changing step, the repeating step and the determining step for at least one additional selected measurable capacitance in the plurality of measurable capacitances.

35. The method of claim 34 wherein the measuring of the plurality of measurable capacitances is used to provide a function selected from the group consisting of a button function, a cursor control function, and a scrolling function.

36. The method of claim 34 wherein timing between the applying step and the allowing step is variably controlled.

37. The method of claim 34 wherein the step of repeating each of the applying step, the allowing step, the comparing step, and the changing step at least once for the selected measurable capacitance comprises repeating the applying step a number of repetitions unequal to a number of repetitions of the changing step.

38. The method of claim 34 wherein the quantized amount of charge based on the quantized value corresponds to a charge on a feedback capacitance generated as a function of the quantized value.

39. The method of claim 34 wherein the quantized amount of charge based on the quantized value corresponds to a current applied through a resistance for a known period of time.

40. The method of claim 34 wherein the threshold voltage comprises a threshold voltage of an analog-to-digital converter.

41. The method of claim 34 wherein the threshold voltage comprises a reference voltage of a comparator.

42. The method of claim 34 wherein the applying step comprises discharging the measurable capacitance, the allowing step comprises discharging the passive network, and the changing a charge step comprises adding charge to the passive network.

43. The method of claim 34 further comprising the step of applying a first guarding voltage to a guarding electrode distinct from the plurality of measurable capacitances.

44. The method of claim 43 wherein the first guarding voltage applied to the guarding electrode is substantially equal to the predetermined voltage applied to the selected measurable capacitance.

45. The method of claim 44 further comprising the step of applying a second guarding voltage different from the first guarding voltage to the guarding electrode.

46. The method of claim 45 wherein the second guarding voltage is substantially equal to the threshold voltage.

47. The method of claim 34 wherein the threshold voltage comprises an input threshold of a digital input of an integrated circuit.

48. The method of claim 34 wherein the step of determining the value of the selected measurable capacitance by digitally filtering quantized values comprises summing the quantized values.

49. The method of claim 34 wherein the step of determining the value of the selected measurable capacitance by digitally filtering quantized values comprises averaging the quantized values.

* * * * *